(12) United States Patent
Zhou et al.

(10) Patent No.: US 12,217,658 B2
(45) Date of Patent: Feb. 4, 2025

(54) DISPLAY PANEL AND DISPLAY APPARATUS

(71) Applicants: Wuhan Tianma Microelectronics Co., Ltd. Shanghai Branch, Shanghai (CN); WUHAN TIANMA MICROELECTRONICS CO., LTD., Wuhan (CN)

(72) Inventors: Xingyao Zhou, Shanghai (CN); Qibing Wei, Shanghai (CN); Peng Zhang, Shanghai (CN); Mengmeng Zhang, Shanghai (CN); Wei Liu, Shanghai (CN); Kang Yang, Shanghai (CN); Gaojun Huang, Shanghai (CN); Yana Gao, Shangai (CN)

(73) Assignees: Wuhan Tianma Microelectronics Co., Ltd. Shanghai Branch, Shanghai (CN); Wuhan Tianma Microelectronics Co., Ltd., Wuhan (CN)

( * ) Notice: Subject to any disclaimer, the term of this patent is extended or adjusted under 35 U.S.C. 154(b) by 0 days.

(21) Appl. No.: 18/058,676

(22) Filed: Nov. 23, 2022

(65) Prior Publication Data

US 2023/0377508 A1 Nov. 23, 2023

(30) Foreign Application Priority Data

Sep. 6, 2022 (CN) .......................... 202211086347.3

(51) Int. Cl.
*G09G 3/32* (2016.01)
*H01L 27/12* (2006.01)

(52) U.S. Cl.
CPC ............. *G09G 3/32* (2013.01); *H01L 27/124* (2013.01); *G09G 2300/0413* (2013.01);
(Continued)

(58) Field of Classification Search
CPC ............. G09G 2300/0426; G09G 3/32; G09G 2300/0413; G09G 2300/0819; G09G 2300/0842; G09G 2310/08; H01L 27/124
See application file for complete search history.

(56) References Cited

U.S. PATENT DOCUMENTS

2020/0176526 A1\* 6/2020 Yoon ....................... H10K 59/88
2020/0411625 A1\* 12/2020 Seo ..................... G02F 1/13452
(Continued)

FOREIGN PATENT DOCUMENTS

| CN | 110515247 A | 11/2019 |
|---|---|---|
| CN | 113160743 A | 7/2021 |
| CN | 114842809 A | 8/2022 |

OTHER PUBLICATIONS

Office Action mailed Aug. 31, 2023; issued in corresponding Chinese Application No. 202211086347.3 filed Sep. 6, 2022; 31 pages.

*Primary Examiner* — Nitin Patel
*Assistant Examiner* — Amen W Bogale
(74) *Attorney, Agent, or Firm* — CHRISTENSEN O'CONNOR JOHNSON KINDNESS PLLC

(57) ABSTRACT

A display panel has functional component regions arranged along a first direction and a display region at least partially surrounding the functional component regions. The display panel includes first signal lines located in the display region. One of the first signal lines has a least one part extending in the first direction, and the first signal lines are arranged in a second direction intersecting with the first direction. The first signal lines include a first-type signal line and a second-type signal line, and the first-type signal line at least partially surrounds the functional component regions. In the first direction, at least one second-type signal line is broken at two sides of one of the functional component region.

43 Claims, 20 Drawing Sheets

(52) U.S. Cl.
CPC ............... *G09G 2300/0426* (2013.01); *G09G 2300/0819* (2013.01); *G09G 2300/0842* (2013.01); *G09G 2310/08* (2013.01)

(56) References Cited

U.S. PATENT DOCUMENTS

| | | | |
|---|---|---|---|
| 2021/0090490 A1* | 3/2021 | Lee | G06F 1/1637 |
| 2022/0069033 A1* | 3/2022 | Kim | H10K 59/88 |
| 2023/0020515 A1* | 1/2023 | Min | H01L 29/7869 |

* cited by examiner

DISPLAY PANEL AND DISPLAY APPARATUS

CROSS-REFERENCE TO RELATED APPLICATIONS

The present application claims priority to Chinese Patent Application No. 202211086347.3, filed on Sep. 6, 2022, the content of which is incorporated herein by reference in its entirety.

TECHNICAL FIELD

The disclosure relates to the technical field of displaying, and in particular, to a display panel and a display apparatus.

BACKGROUND

The design of display panels is becoming more and more diverse, and currently, a display region of the display panel is provided with a through hole for arranging components such as cameras. The though hole provided in the display region will cut off some signal lines. Therefore, when the display region is provided with at least two though holes, how to arrange signal lines corresponding to the at least two through holes has become the focus of researchers.

SUMMARY

In a first aspect, some embodiments of the present disclosure provide a display panel. The display panel has a display region and at least two functional component regions. The display region at least partially surrounds the at least two functional component regions, and the at least two functional component regions are arranged along a first direction. The display panel includes first signal lines located in the display region. At least part of each first signal line of the first signal lines extends in the first direction, and the first signal lines are arranged in a second direction intersecting with the first direction. The first signal lines include at least one first-type signal line and at least one second-type signal line. One of the at least one first-type signal line at least partially surrounds the at least two functional component regions, and at least one of the at least one second-type signal line is broken at two sides of one functional component region of the at least two functional component regions in the first direction.

In a second aspect, some embodiments of the present disclosure provide a display apparatus. The display panel has a display region and at least two functional component regions. The display region at least partially surrounds the at least two functional component regions, and the at least two functional component regions are arranged along a first direction. The display panel includes first signal lines located in the display region. At least part of each first signal line of the first signal lines extends in the first direction, and the first signal lines are arranged in a second direction intersecting with the first direction. The first signal lines include at least one first-type signal line and at least one second-type signal line. One of the at least one first-type signal line at least partially surrounds the at least two functional component regions, and at least one of the at least one second-type signal line is broken at two sides of one functional component region of the at least two functional component regions in the first direction.

BRIEF DESCRIPTION OF DRAWINGS

In order to clearly explain technical solutions of embodiments of the present disclosure, the drawings of the embodiments are briefly described as below. The drawings described below are merely some of the embodiments of the present disclosure. Those skilled in the art can derive other drawings from these drawings.

DESCRIPTION OF EMBODIMENTS

For facilitating the understanding of the technical solution of the present disclosure, the embodiments of the present disclosure are described in detail below.

It should be understood that the embodiments described below are merely some of, rather than all of the embodiments of the present disclosure. On a basis of the embodiments in this disclosure, all other embodiments obtained by the ordinary skilled in the art are within a protection scope of this disclosure.

The terms used in the embodiments of the present disclosure are merely for the purpose of describing specific embodiments, but not intended to limit the present disclosure. The singular forms of "a", "an" and "the" used in the embodiments of the present disclosure and the appended claims are also intended to indicate plural forms, unless clearly indicating others.

It should be understood that the term "and/or" used herein merely indicates a relationship describing associated objects, indicating three possible relationships. For example, the expression "A and/or B" indicates: A alone, both A and B, or B alone. In addition, the character "/" in this description generally means that the associated objects are in an "or" relationship.

It should be understood that, although the terms first, second, third, etc. in the embodiments of the present disclosure are used to describe functional component regions, these functional component regions should not be limited to these terms, and these terms are only used to distinguish the functional component regions from each other. For example, without departing from the scope of the embodiments of the present disclosure, the first functional component region can also be referred to as the second functional component region, and similarly, the second functional component region can also be referred to as the first display functional component region.

Figure 1:
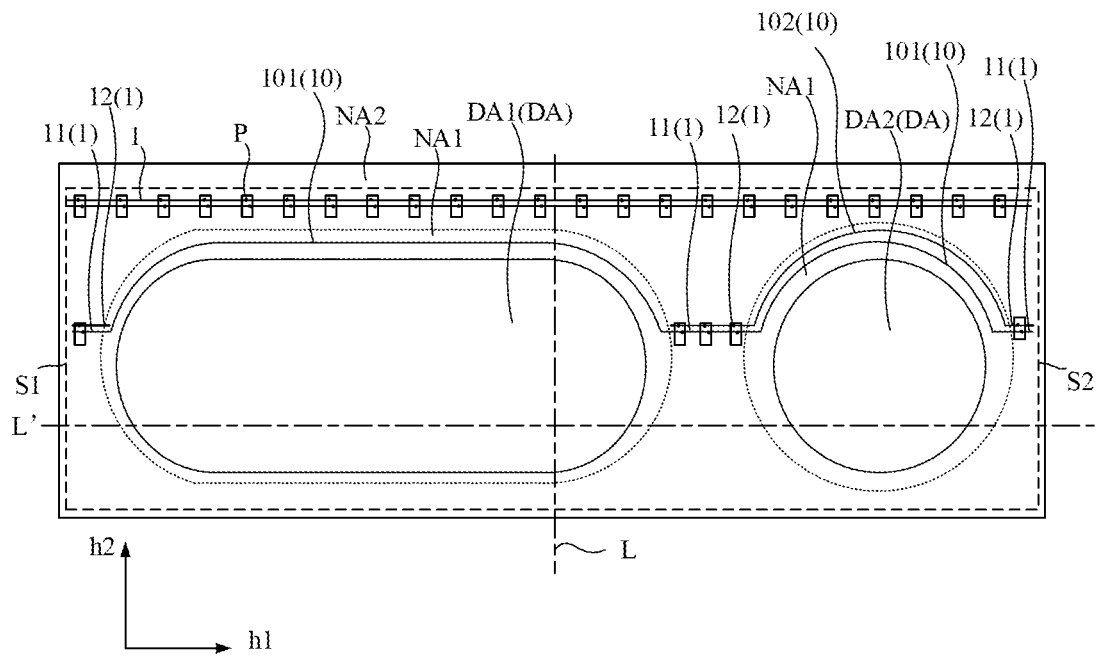
FIG. 1 is a schematic diagram illustrating a partial region of a display panel according to some embodiments of the present disclosure.

Embodiments of the present disclosure provide a display panel. FIG. 1 is a schematic diagram of a display panel according to some embodiments of the present disclosure. As shown in FIG. 1, the display panel includes a display region AA and at least two functional component regions DA, and the display region AA at least partially surrounds the at least two functional component regions DA. The at least two functional component regions DA are arranged along a first direction h1. A straight line L' parallel to the first direction h1 passes through the at least two functional component regions DA. In embodiments of the present disclosure, light transmittance of the functional component region DA is greater than light transmittance of the display region AA. The display panel includes multiple sub-pixels in the display region AA. Exemplarily, no sub-pixel is provided in the functional component region DA.

In the embodiments of the present disclosure, the functional component region DA may be arranged in various forms. For example, a though hole or a blind hole is provided in the functional component region DA. The though hole penetrates through the display panel in a thickness direction of the display panel and may be formed by penetrating the display panel. The blind hole does not penetrate though the display panel in the thickness direction of the display panel. No sub-pixel is arranged in the functional component region DA, and thus the functional component region DA has a greater light transmittance.

Exemplarily, the at least two functional component regions DA may have a same shape, or different shapes. Exemplarily, in some embodiments, the at least two functional component regions DA may have a same area or different areas.

As shown in FIG. 1, the display panel includes multiple first signal lines 1 in the display region AA. At least a part of the first signal line 1 extends in the first direction h1. The first signal lines 1 are arranged in a second direction h2. The first direction h1 intersects with the second direction h2. The first signal line 1 is electrically connected to multiple sub-pixels P arranged in the first direction h1.

In some embodiments of the present disclosure, the first signal lines 1 include a first-type signal line 11 and a second-type signal line 12. The first-type signal line 11 and the second-type signal line 12 are both arranged corresponding to the functional component region DA. That is, in the first direction h1, a part of the first-type signal line 11 and a part of the second-type signal line 12 both overlap with the functional component region DA. Specifically, in some embodiments of the present disclosure, the first-type signal line 11 at least partially surrounds at least two functional component regions DA. In the first direction h1, at least one second-type signal line 12 is broken at two sides of one of the at least two functional component regions DA.

In the display panel provided by embodiments of the present disclosure, the first-type signal line 11 is arranged to at least partially surround at least two functional component regions DA, and thus a signal transmitted by the first-type signal line 11 can be normally transmitted between two sides of the functional component region DA in the first direction h1, ensuring sub-pixels located on two sides of the functional component region DA to operate normally.

In some embodiments of the present disclosure, the second-type signal line 12 is broken at two sides of one functional component region DA of the at least two functional component regions DA, and a connecting line in the periphery of the one functional component region DA for connecting two terminals of the second-type signal line 12 at two sides of one functional component region DA may not be included. If connecting lines for connecting the second-type signal line 12 are provided in the peripheries of the at least two functional component regions DA, the load of the second-type signal line 12 may be greatly increased, causing load unconformity between the second-type signal line 12 arranged corresponding to the functional component region DA and another signal line arranged not corresponding to the functional component region DA. The connecting lines for connecting the second-type signal line 12 occupy space and cause an increase of the density of the second-type signal line 12, increasing the risk of signal crosstalk. Accordingly, in the embodiments of the present disclosure, the second-type signal line 12 is broken at two sides of one functional component region DA of the at least two functional component regions DA, the load difference of the second-type signal lines 12 arranged at different positions of the display panel can be balanced, and the space occupied by connecting lines is reduced, and signal crosstalk is avoided.

Exemplarily, as shown in FIG. 1, the display panel includes a dummy line L that extends in the second direction h2. In the first direction h1, the display region AA includes a first edge S1 and a second edge S2 that are opposite to each other. A distance d1 between the first edge S1 and the dummy line L and a distance d2 between the second edge S2 and the dummy line L satisfy $0.9 \leq d1/d2 \leq 1.1$. It can be understood that the distance between the dummy line L and the first edge S1 and the distance between the dummy line L and the second edge S2 are substantially equal to each other. The at least two functional component regions DA include a first functional component region DA1 and a second functional component region DA2, and the dummy line L passes through the first functional component region DA1. In the first direction h1, the second-type signal line 12 is broken at two sides of the first functional component region DA1. With the above configuration, the loads of the two parts of the second-type signal line 12 that are disconnected at the first functional component region DA1 are substantially equal, and the display uniformity of sub-pixels connected to the two parts of the second-type signal line 12 that are disconnected at the first functional component region DA1 is improved.

Figure 2:
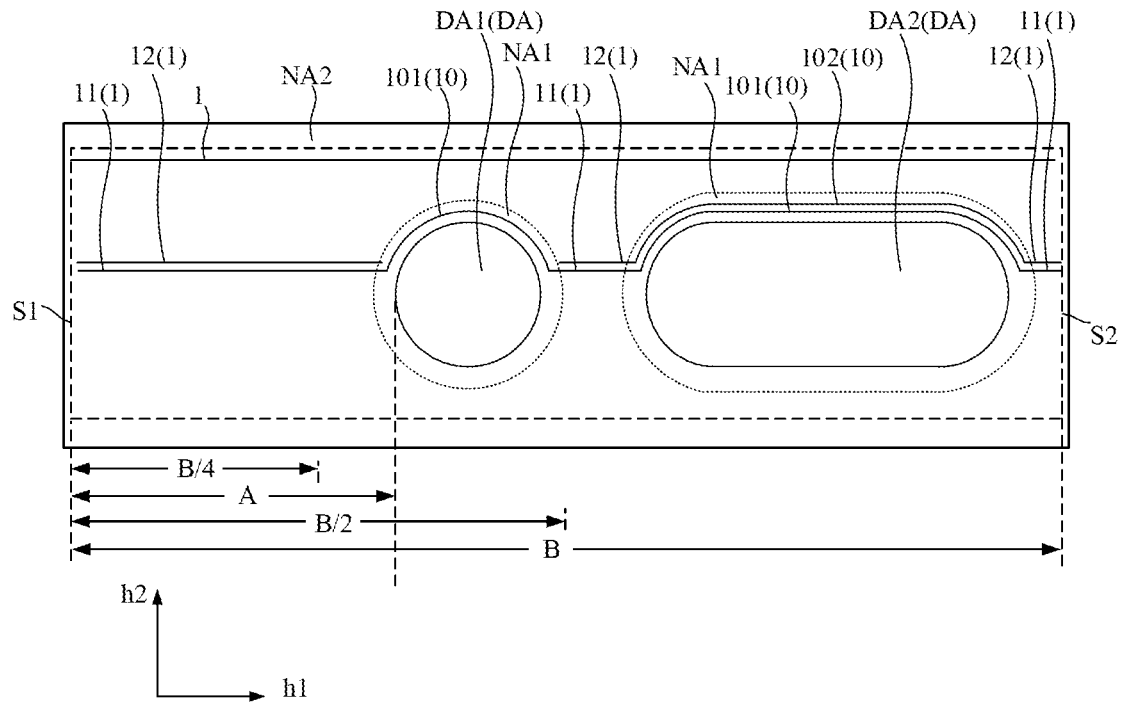
FIG. 2 is a schematic diagram illustrating a partial region of another display panel according to some embodiments of the present disclosure.

FIG. 2 is a schematic diagram of another display panel according to some embodiments of the present disclosure. In some embodiments, as shown in FIG. 2, the at least two functional component regions DA include a first functional component region DA1 and a second functional component region DA2. The display region AA has a length B in the first direction h1, the first functional component region DA1 has a distance A in the first direction h1 to an edge of the display region AA, and $B/4 \leq A \leq B/2$. Exemplarily, as shown in FIG. 2, the display region AA includes a first edge S1 and a second edge S2 that are opposite to each other in the first direction h1. The distance between the first functional component region DA1 and the first edge S1 may be equal to A. Alternatively, the distance between the first functional component region DA1 and the second edge S2 may be equal to A. In embodiments of the present disclosure, in the first direction h1, the second-type signal line 12 is broken at two sides of the first functional component region DM. In embodiments of the present disclosure, the distance A between the first functional component region DA1 and the first edge S1 is arranged to satisfy: $B/4 \leq A \leq B/2$, such that the first functional component region DA1 is prevented from being neither too close to the first edge S1 nor too far away to the first edge S1. In one embodiment, A may equal to B/3, and thus any one of the two optical component areas can achieve that when the requirement of A is satisfied, the second-type signal line 12 corresponding to this optical component area can be arranged to be broken, expanding the selectivity of the disconnection arrangement of the second-type signal line.

Figure 3:
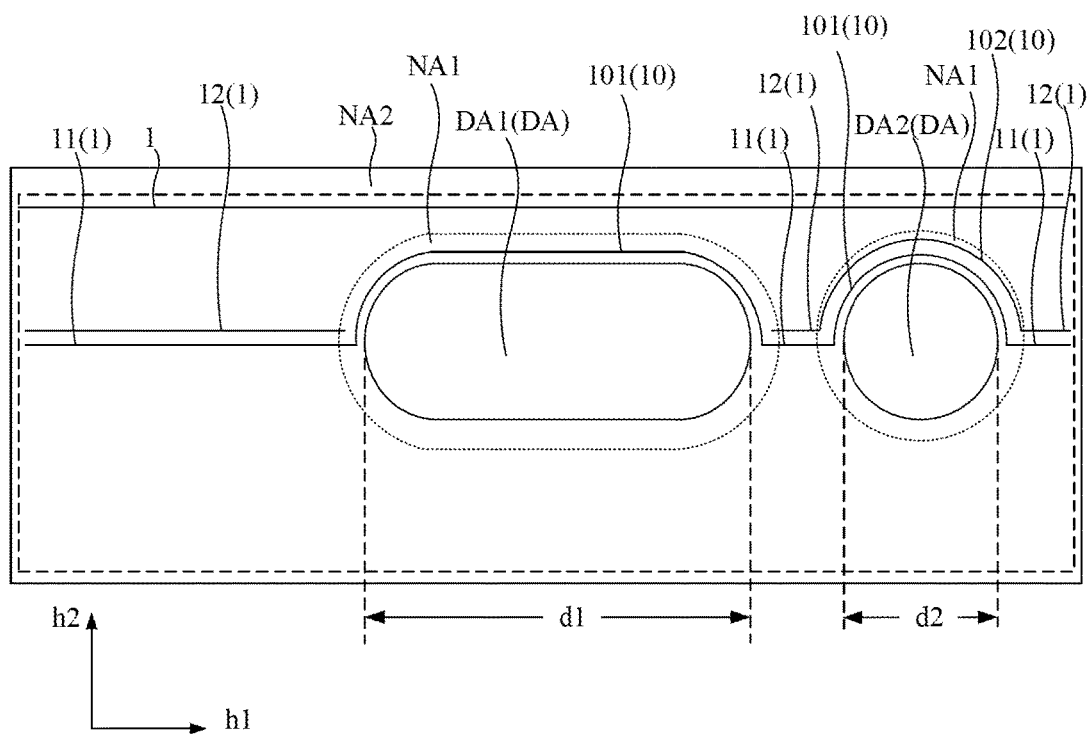
FIG. 3 is a schematic diagram illustrating a partial region of yet another display panel according to some embodiments of the present disclosure.

FIG. 3 is a schematic diagram illustrating a partial region of yet another display panel according to some embodiments of the present disclosure. Exemplarily, as shown in FIG. 3, the at least two functional component regions DA include a first functional component region DA1 and a second functional component region DA2. In the first direction h1, a length d1 of the first functional component region DA1 is greater than a length d2 of the second functional component region DA2. In the first direction h1, the second-type signal line 12 is broken at two sides of the first functional component region DA1. Since the first functional component region DA1 has a greater length, the quantity of signal lines (not shown in FIG. 3) that extend in the second direction h2 and are interrupted by the first functional component region DA1 is also greater. In the present embodiment, the second-type signal line 12 is broken at two sides of the first functional component region DA1 having a greater length, so the quantity of the connect line that may be provided in the periphery of the first functional component region DA1 for connecting the second-type signal line 12 is reduced, which is beneficial to reduce the width of the first non-display region NA1 around the first functional component region DA1.

Exemplarily, for the first functional component region DA1 having a greater length in the first direction h1, the dummy line L passing through the display panel may be provided for the first functional component region DA1 in some embodiments. In some embodiments, the distance A between one edge of the display region AA and the first functional component region DA1 having a greater length in the first direction h1 satisfies $B/4 \leq A \leq B/2$.

Exemplarily, as shown in FIG. 1, FIG. 2, and FIG. 3, the first signal line 1 includes a first connecting line 10, and the first connecting line 10 electrically connects two parts of the first signal line 1 that are located at two sides of at least one functional component region DA. Exemplarily, the first connecting line 10 and the functional component region DA are arranged in the second direction h2.

Exemplarily, as shown in FIG. 1, FIG. 2, and FIG. 3, the first connecting lines 10 include a first-type connecting line 101 and a second-type connecting line 102. The first-type connecting line 101 belongs to the first-type signal line 11, and the second-type connecting line 102 belongs to the second-type signal line 12. That is, the first-type signal line 11 includes the first-type connecting line 101, and the first-type connecting line 101 electrically connects two parts of the first-type signal line 11 that are located at two sides of the functional component region DA. The second-type signal line 12 includes the second-type connecting line 102, and the second-type connecting line 102 electrically connects two parts of the second-type signal line 12 that are located at two sides of the functional component region DA.

In embodiments of the present disclosure, as shown in FIG. 1, FIG. 2, and FIG. 3, the quantity of the first-type connecting line 101 is greater than the quantity of the second-type connecting line 102. For example, the first signal lines 10 include at least two first-type connecting lines 101 and at least one second-type connecting line 102. The at least two first-type connecting lines 101 are arranged corresponding to the at least two functional component regions DA respectively. As shown in FIG. 1, FIG. 2, and FIG. 3, if the display panel includes the first functional component region DA1 and the second functional component region DA2, one first-type connecting line 101 electrically connects two parts of the first-type signal line 11 that are located at two sides of the first functional component region DA1, and another first-type connecting line 101 electrically connects two parts of the first-type signal line 11 that are located at two sides of the second functional component region DA2. If the second-type signal line 12 is broken at the two sides of the first functional component region DA1, the second-type connecting line 102 electrically connects two parts of the second-type signal line 12 that are located at two sides of the second functional component region DA2.

Exemplarily, as shown in FIG. 1, FIG. 2, and FIG. 3, the display panel further includes a first non-display region NA1 located between the functional component region DA and the display region AA in the second direction h2. At least one part of the first connecting line 10 is located in the first non-display region NA1. Exemplarily, as shown in FIG. 1, FIG. 2, and FIG. 3, at least one part of the first connecting line 10 extends in the direction along which the edge of the functional component region DA that is closes to the first connecting line 10 extends. For example, if the edge of the functional component region DA includes an arc, the at least one part of the first connecting line 10 is also set as an arc.

Figure 4:
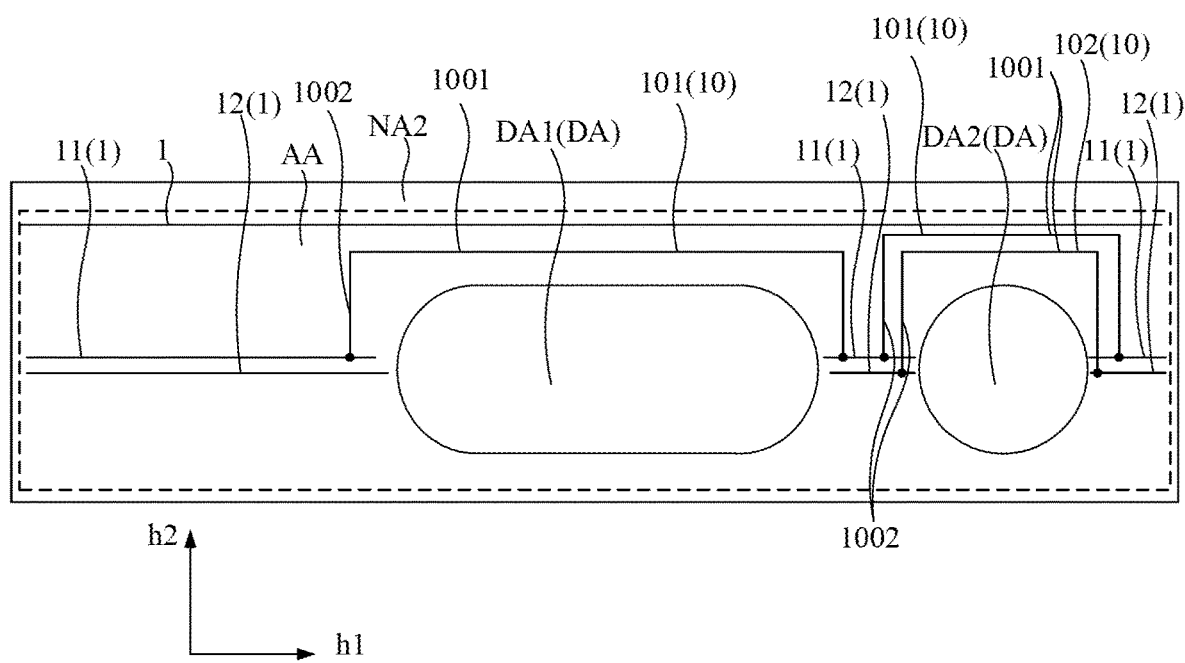
FIG. 4 is a schematic diagram illustrating a partial region of yet another display panel according to some embodiments of the present disclosure.

Exemplarily, in some embodiments of the present disclosure, at least one part of the first connecting line 10 is arranged in the display region AA. Such configuration is beneficial to reducing the width of the first non-display region NA1. FIG. 4 is a schematic diagram illustrating a partial region of yet another display panel according to some embodiments of the present disclosure. As shown in FIG. 4, the first connecting lines 10 include a first-type connecting line 101 and a second-type connecting line 102. At least one part of the first connecting line 101 is located in the display region AA, and at least one part of the second connecting line 102 is located in the display region AA. In some embodiments, one of the first connecting line 101 and the second connecting line 102 is located in the display region AA, and the other one of the first connecting line 101 and the second connecting line 102 is located in the first non-display region NA1, which is not illustrated in figures herein.

If at least one part of the first connecting line 10 is arranged in the display region AA, exemplarily, as shown in FIG. 4, the first connecting line 10 includes a first segment 1001 and a second segment 1002 that are electrically connected to each other, and the first segment 1001 and the second segment 1002 extend in different directions. Exemplarily, as shown in FIG. 4, the first segment 1001 extends in the first direction h1, and the second segment 1002 extends in the second direction h2. In some embodiments, the first segment 1001 and the second segment 1002 are located in a same layer. In another embodiment, the first segment 1001 and the second segment 1002 are located in different layers and are connected to each other through a via.

Figure 5:
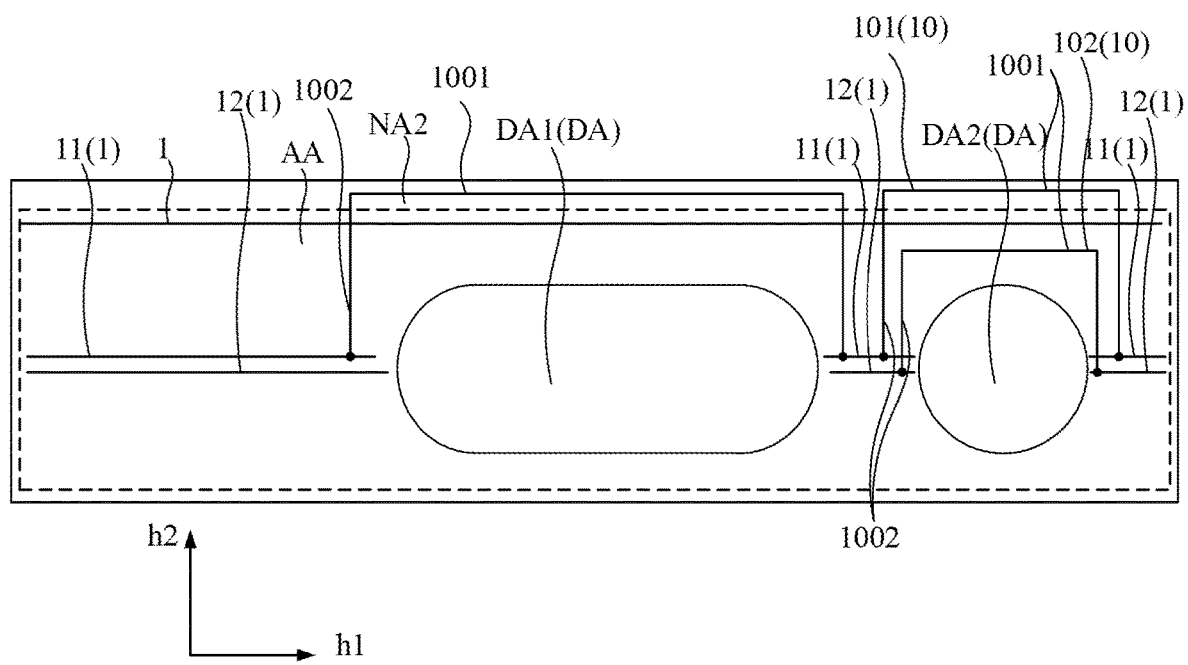
FIG. 5 is a schematic diagram illustrating a partial region of yet another display panel according to some embodiments of the present disclosure.

FIG. 5 is a schematic diagram illustrating a partial region of yet another display panel according to some embodiments of the present disclosure. Exemplarily, as shown in FIG. 5, the display panel includes a second non-display region NA2 located at a side of the display region AA away from the functional component region DA. At least one part of the first connecting line 10 is located in the second on-display region NA2. In the embodiment shown in FIG. 5, the first segment 1001 of the first-type connecting line 101 is arranged in the second non-display region NA2, and the first segment 1001 and the second segment 1002 of the second-type connecting line 102 are both located in the display region AA. With such configuration, the first connecting line 10 is prevented from being interfered by another signal line that is located in the display region AA and that transmits a different signal.

Figure 6:
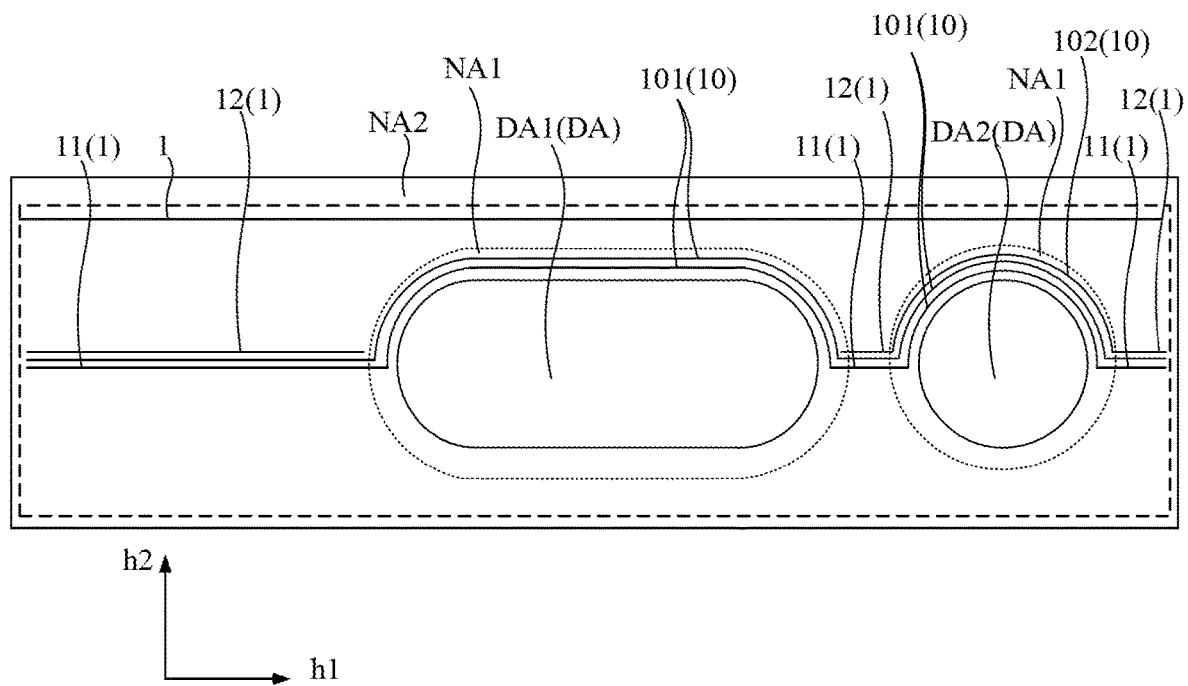
FIG. 6 is a schematic diagram illustrating a partial region of yet another display panel according to some embodiments of the present disclosure.

Exemplarily, the display panel includes a plurality of first signal lines 1 corresponding to the functional component regions DA. In the second direction h2, the first signal lines 1 include first connecting lines 10 that are located at a same side of the functional component region DA. FIG. 6 is a schematic diagram illustrating a partial region of yet another display panel according to some embodiments of the present disclosure. As shown in FIG. 6, the display panel includes a first functional component region DA1 and a second functional component region DA2. The display panel includes three first signal lines 1 corresponding to the first functional component region DA1 and the second functional component region DA2. The three first signal lines 1 include two first-type signal lines 11 and one second-type signal line 12. The second-type signal line 12 is broken at two sides of the first functional component region DA1, and two parts of the second-type signal line 12 that are located at two sides of the second functional component region DA2 are electrically connected to each other by the first connecting line 10. In the periphery of the first functional component region DA1, two first connecting lines 10 are both located at a first side of the first functional component region DA1. In the periphery of the second functional component region DA2, three first connecting lines 10 are all located at a first side of the second functional component region DA2. In other embodiments of the present disclosure, the first connecting lines 10 may be located at a second side of the first functional component region DA1 and a second side of the functional component region DA2, which is not illustrated in figures herein. The first side and the second side of the first functional component region DA1 are arranged along the second direction h2. The first side and the second side of the second functional component region DA2 are arranged along the second direction h2.

In the embodiment shown in FIG. 6, the first connecting lines 10 are all arranged in the first non-display region NA1. The embodiments of the present disclosure are not limited to the above configurations. The first connecting lines 10 described in the above embodiment may be arranged in the second non-display region NA2, or may be arranged in the display region AA, or may be arranged in at least two of the first non-display region NA1, the second non-display region NA2, or the display region AA.

Figure 7:
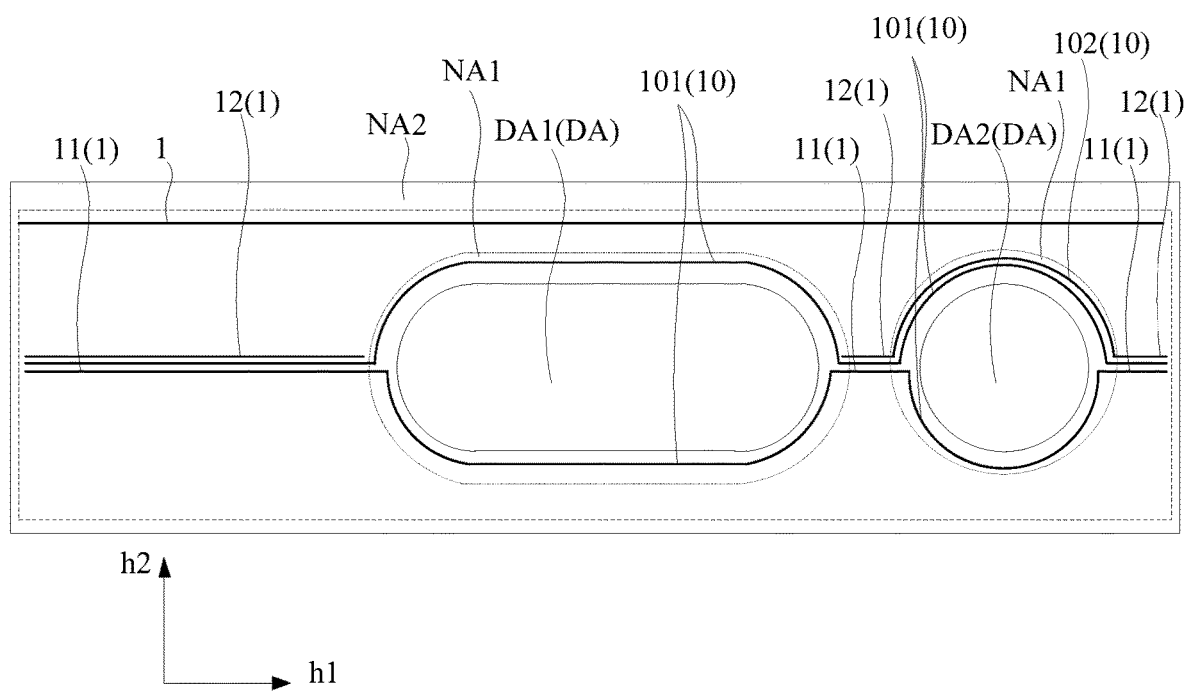
FIG. 7 is a schematic diagram illustrating a partial region of yet another display panel according to some embodiments of the present disclosure.

In some other embodiments, in the second direction h2, the first connecting line 10 of one first signal line 1 is arranged at a side of the functional component region DA, and the first connecting line 10 of another first signal line 1 is arranged at another side of the functional component region DA. FIG. 7 is a schematic diagram illustrating a partial region of yet another display panel according to some embodiments of the present disclosure. As shown in FIG. 7, the display panel includes a first functional component region DA1 and a second functional component region DA2. The display panel further includes three first signal lines 1 corresponding to the first functional component region DA1 and the second functional component region DA2. Two first signal lines of the three first signal lines 1 are the first-type signal lines 11, and the remaining one of the three first signal lines 1 is the second-type signal line 12. The second-type signal line 12 is broken at two sides of the first functional component region DA1, and two parts of the second-type signal line 12 that are located at two sides of the second functional component region DA2 are electrically connected to each other by the first connecting line 10. In the periphery of the first functional component region DA1, one first connecting line 10 is located at a first side of the first functional component region DA1, and another first connecting line 10 is located at a second side of the first functional component region DA1. In the periphery of the second functional component region DA2, two first connecting lines 10 are located at a first side of the second functional component region DA2, and another first connecting line 10 is at a second side of the second functional component region DA2. In some embodiments, in the periphery of the second functional component region DA2, the two first connecting lines 10 are located at the second side of the second functional component region DA2, and another first connecting line 10 is located at the first side of the second functional component region DA2. The quantity of the first connecting lines is not limited to embodiments of the present disclosure.

In some embodiments of the present disclosure, the first connecting lines 10 may be arranged in at least one of the first non-display region NA1, the second non-display region NA2, or the display region AA, which is not limited in embodiments of the present disclosure.

In some embodiments, in the second direction h2, the quantity of the first connecting lines 10 at the first side of the functional component region DA is equal to the quantity of the first connecting lines 10 at the second side of the functional component region DA, such that the width of the first non-display region NA1 at the first side of the functional component region DA is substantially the same as the width of the first non-display region NA1 at the second side of the functional component region DA.

Figure 8:
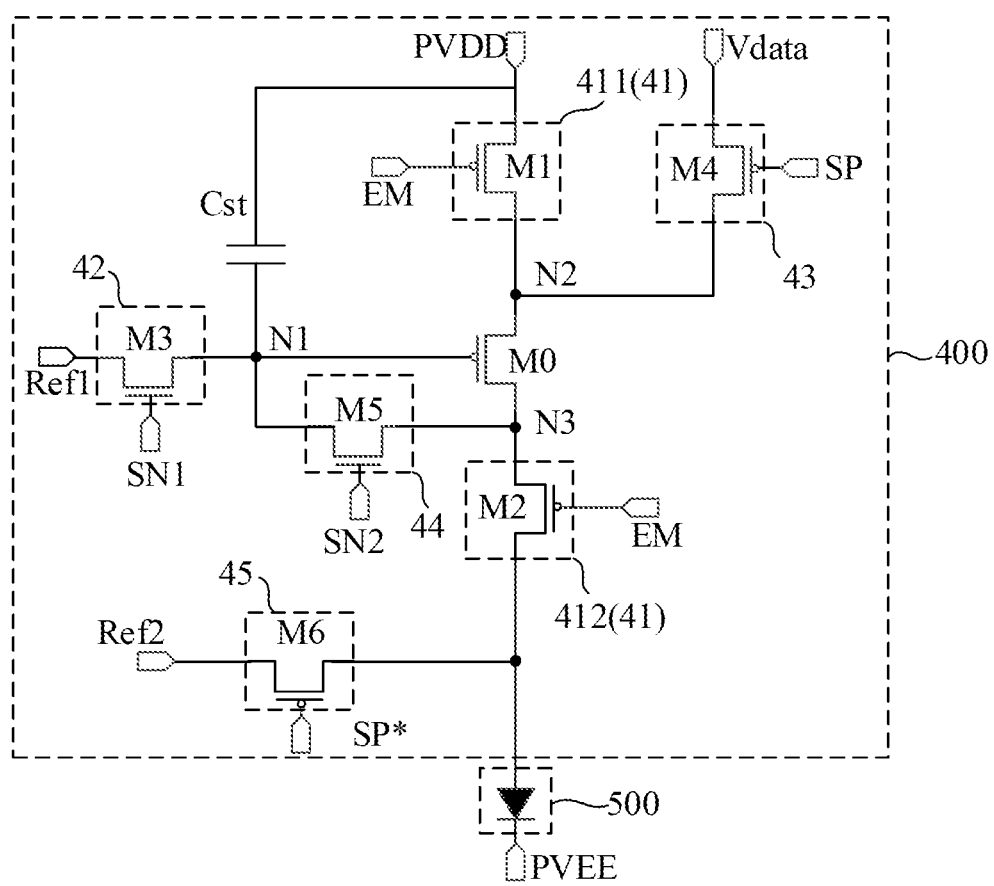
FIG. 8 is a schematic circuit diagram of a sub-pixel according to some embodiments of the present disclosure.

FIG. 8 is a schematic circuit diagram of a sub-pixel P according to some embodiments of the present disclosure. Exemplarily, as shown in FIG. 8, the sub-pixel P includes a pixel driving circuit 400 and a light-emitting element 500 that are electrically connected to each other. The pixel driving circuit 400 includes a driving transistor M0, a light-emitting control circuit 41, a gate reset transistor 42, a data input circuit 43, a threshold voltage compensation circuit 44, and a light-emitting element reset circuit 45.

A control electrode of the driving transistor M0 is electrically connected to a first node N1, a first electrode of the driving transistor M0 is electrically connected to a second node N2, and a second electrode of the driving transistor M0 is electrically connected to a third node N3.

The light-emitting control circuit 41 includes a first control sub-circuit 411 and a second control sub-circuit 412. An input terminal of the first control sub-circuit 411 is electrically connected to a first power supply voltage line PVDD, and an output terminal of the first control sub-circuit 411 is electrically connected to the first electrode of the driving transistor M0. An input terminal of the control sub-circuit 412 is electrically connected to the second electrode of the driving transistor M0, and an output terminal of the control sub-circuit 412 is electrically connected to a first electrode of the light-emitting element 500. A second electrode of the light-emitting element 500 is electrically connected to a second power supply voltage line PVEE. A control terminal of the first control sub-circuit 411 and a control terminal of the second control sub-circuit 412 are both electrically connected to a light-emitting control signal line EM.

A control terminal of the gate reset circuit 42 is electrically connected to a first scanning control signal line SN1, an input terminal of the gate reset circuit 42 is electrically connected to a first reset signal line Ref1, and an output terminal of the gate reset circuit 42 is electrically connected to the gate of the driving transistor M0.

A control terminal of the data input circuit 43 is electrically connected to a second scanning control signal line SP, an input terminal of the data input circuit 43 is electrically connected to a data signal line Vdata, and an output terminal of the of the data input circuit 43 is electrically connected to the first electrode of the driving transistor M0.

A control terminal of the threshold voltage compensation circuit 44 is electrically connected to a third scanning control signal line SN2, an input terminal of the threshold voltage compensation circuit 44 is electrically connected to the second electrode of the driving transistor M0, and an output terminal of the threshold voltage compensation circuit 44 is electrically connected to the gate of the driving transistor M0.

A control terminal of the light-emitting element reset circuit 45 is electrically connected to a fourth scanning control signal line SP*, an input terminal of the light-emitting element reset circuit 45 is electrically connected to a second reset signal line Ref2, and an output terminal of the light-emitting element reset circuit 45 is electrically connected to the first electrode 500 of the light-emitting element 500.

Exemplarily, as shown in FIG. 8, the first control sub-circuit 411 includes a first transistor M1; the second control sub-circuit 412 includes a second transistor M2; the gate reset circuit 42 includes a third transistor M3; the data input circuit 43 includes a fourth transistor M4; the threshold voltage compensation circuit 44 includes a fifth transistor M4; and the light-emitting element reset circuit 45 includes a sixth transistor M5. The pixel driving circuit 400 includes a storage capacitor Cst. A first electrode plate of the storage capacitor Cst is electrically connected to the first node N1, and a second electrode plate of the storage capacitor Cst is electrically connected to the first power supply voltage line PVDD.

Exemplarily, the third transistor M3 and the fifth transistor M5 may be oxide transistors, for example, Indium Gallium Zinc Oxide (IGZO) transistors, such that the third transistor M3 and the fifth transistor M5 have a smaller off-state leakage, thereby improving the potential stability of the first node N1. When the display panel is working in a low frequency display mode, the potential of the first node N1 may be be maintained for a long time, and the configuration that the third transistor M3 and the fifth transistor M5 electrically connected to the first node N1 are IGZO transistors can ensure the brightness uniformity of the light-emitting element 500 in the low-frequency display mode.

Figure 9:
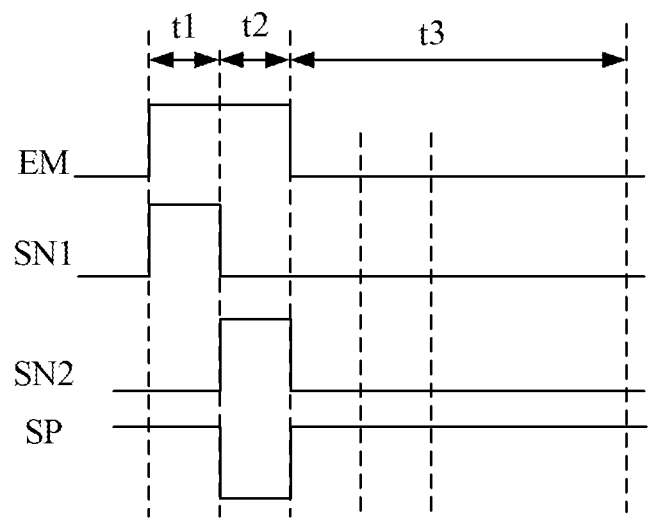
FIG. 9 is a working timing diagram of a pixel driving circuit according to some embodiments of the present disclosure.

FIG. 9 is a working timing diagram of a pixel driving circuit according to some embodiments of the present disclosure. As shown in FIG. 9, the working process of the pixel driving circuit includes a reset phase t1, a charging phase t2, and a light-emitting phase t3.

During the reset phase t1, the first scanning control signal line SN1 controls the third transistor M3 to be turned on, and a first reset signal provided by the first reset signal line Ref1 resets the potential of the first node N1 through the third transistor M3.

During the charging phase t2, the second scanning control signal line SP controls the fourth transistor M4 to be turned on, and a data voltage Vdata provided by a data voltage terminal Vdata is inputted to the second node N2 through the fourth transistor M4. The driving transistor M0 is turned on. In the charging phase t2, the third scanning control signal line SN2 controls the fifth transistor M5 to be turned on. In the charging phase t2, the potential of the first node N1 changes continuously until the potential $V_{N1}$ of the first node N1 is equal to $V_{N1}=V_{data}-|V_{th}|$, where $V_{th}$ is the threshold voltage of the driving transistor M0. In other embodiments, during the charging phase t2, the fourth scanning control signal line SP* controls the sixth transistor M6 to be turned on, and a second reset signal provided by the second reset signal line Ref2 resets the light-emitting element 500 though the sixth transistor M6. Exemplarily, the first reset signal and the second reset signal may be equal. Exemplarily, the signal provided by the fourth scanning control signal line SP* and the signal provided by the second scanning control signal line SP may be equal. For example, the fourth scanning control signal line SP* may be electrically connected to the second scanning control signal line SP.

During the light-emitting phase t3, the first transistor M1, the second transistor M2, and the driving transistor M0 are turned on, the third transistor M3, the fourth transistor M4, and the fifth transistor M5 are turned off, and the light-emitting element 500 connected to the pixel driving circuit 400 emits light.

Exemplarily, the second-type signal lines 12 include a control signal line, and the control signal line refers to the signal line that is electrically connected to the control electrode of at least one of transistors in the above pixel driving circuit 400.

Figure 10:
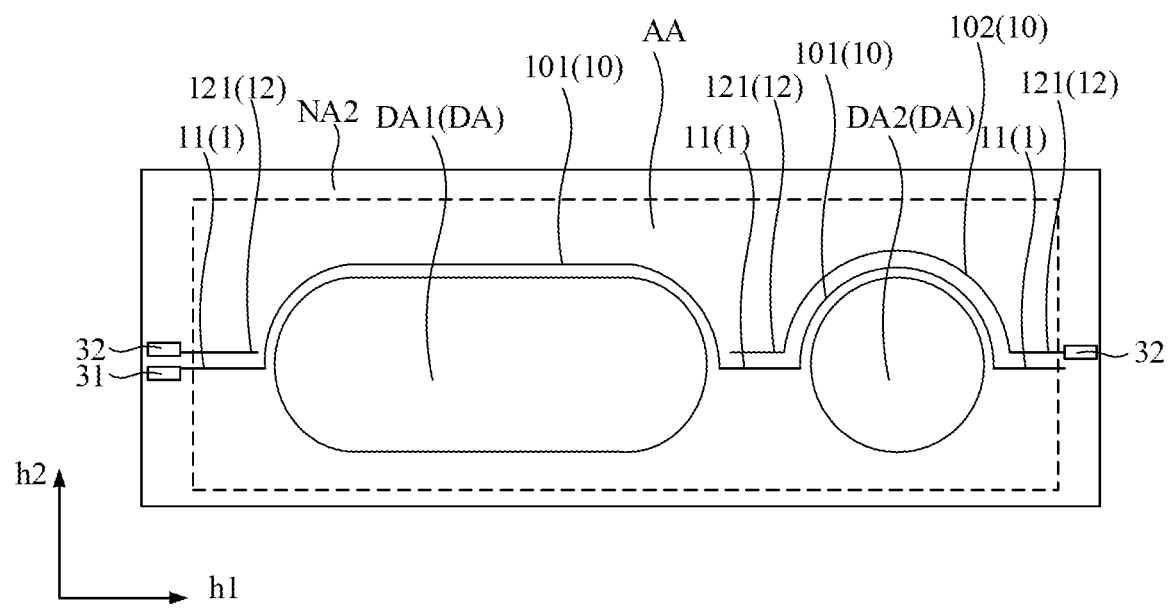
FIG. 10 is a sectional diagram illustrating a partial region of yet another display panel according to some embodiments of the present disclosure.

FIG. 10 is a sectional diagram illustrating a partial region of yet another display panel according to some embodiments of the present disclosure. In an exemplary embodiment, as shown in FIG. 10, the display panel further includes a second non-display region NA2, and the display region AA is at least partially surrounded by the second non-display region NA2. The display panel further includes a first-type driving circuit 31 and a second-type driving circuit 32 located in the second non-display region NA2. The first-type driving circuit 31 is electrically connected to the first-type signal line 11. In the first direction h1, the first-type driving circuit 31 is located on one side of the display region AA. The second-type driving circuit 32 is electrically connected to a control signal line 121. In the first direction h1, two sides of the display region AA each are provided with the second-type driving circuit 32. That is, the second-type driving circuits 32 employ a bilateral driving manner, while the first-type driving circuit 31 employs a unilateral driving manner. In embodiments of the present disclosure, the second-type driving circuits 32 are arranged to drive the control signal line 121 from two sides, such that the voltage drop of the signal provided by the second-type driving circuits 32 on the control signal line 121 can be reduced, thereby avoiding a large delay of the signal provided by the second-type driving circuits 32 and ensuring the accuracy of the signal. In addition, in embodiments of the present disclosure, the control signal line 121 is broken at one functional component region DA, two parts of the control signal line 121 located on two sides of this functional component region DA can receive the signal respectively from two second-type driving circuits 32 located on two sides of the display region AA, ensuring that the sub-pixels P located on two sides of this functional component region DA are normally driven.

Figure 11:
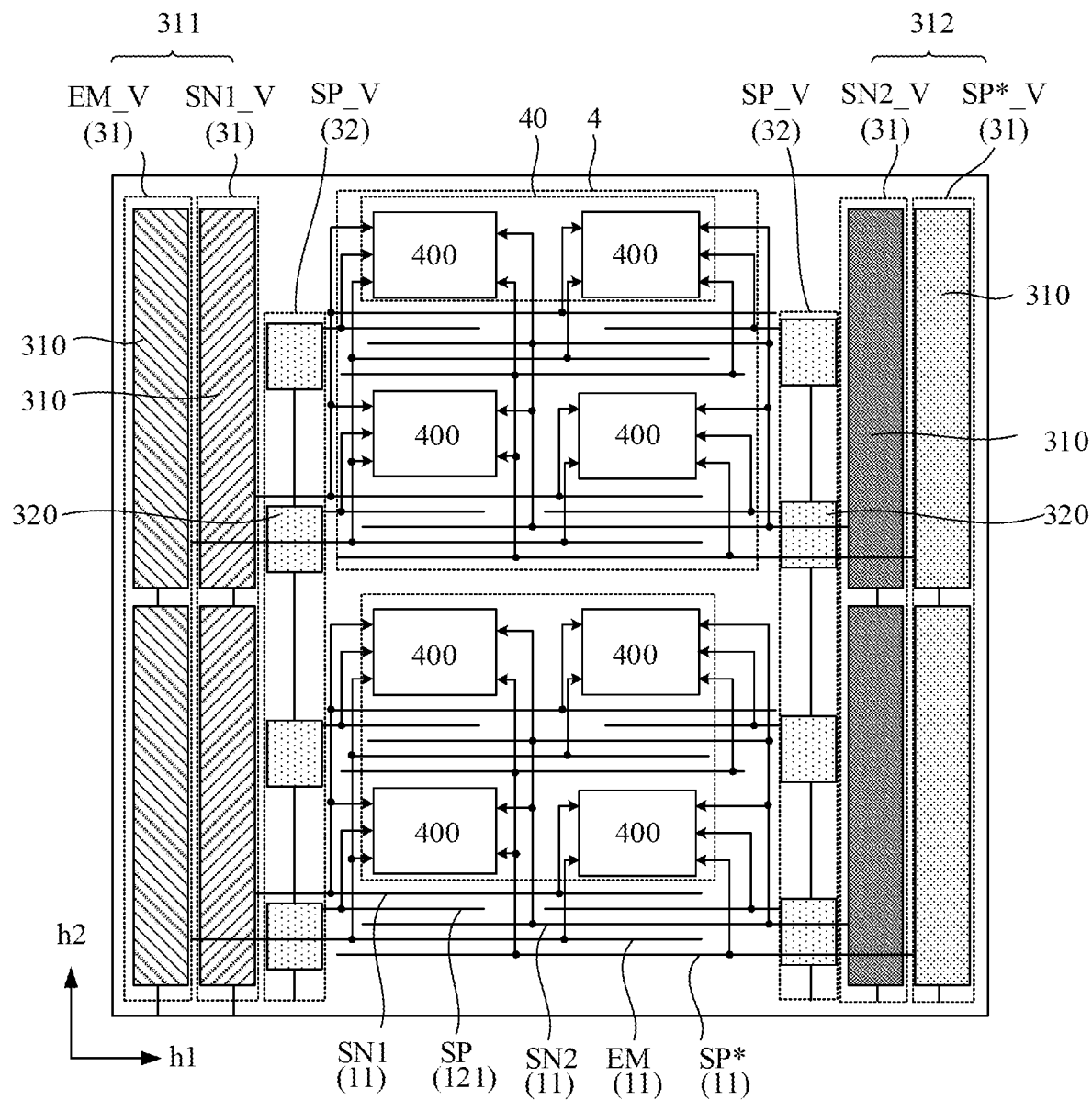
FIG. 11 is a schematic diagram of another display panel according to some embodiments of the present disclosure.
Figure 12:
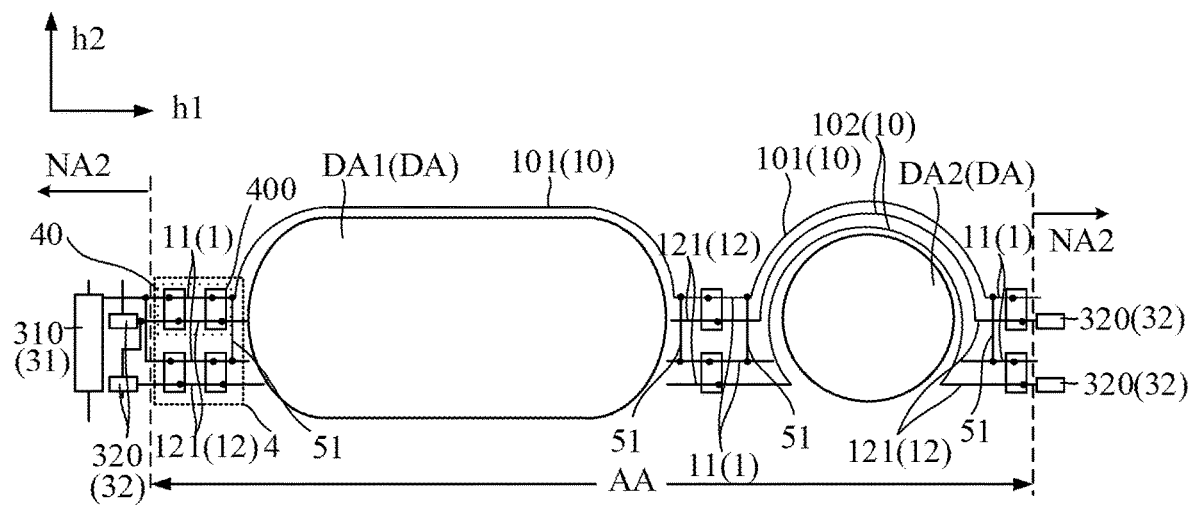
FIG. 12 is a schematic diagram of yet another display panel according to some embodiments of the present disclosure.

FIG. 11 is a schematic diagram of another display panel according to some embodiments of the present disclosure. FIG. 12 is a schematic diagram of yet another display panel according to some embodiments of the present disclosure. In some exemplary embodiments, as shown in FIG. 11 and FIG. 12, the display panel includes pixel driving circuit groups 4 located in the display region AA and arranged in the second direction h2. The pixel driving circuit group 4 includes at least two pixel driving circuit rows 40 arranged in the second direction h2. The pixel driving circuit row 40 includes pixel driving circuits 400 arranged in the first direction h1. The first-type driving circuit 31 includes first-type driving units 310 that are cascaded. The second-type driving circuit 32 includes second-type driving units 320 that are cascaded. One first-type driving unit 310 is electrically connected to at least two pixel driving circuit rows 40 in one pixel driving circuit group 4 though at least two first-type signal lines 11. That is, the first-type driving unit 310 in embodiments of the present disclosure adopts a one-driving-multiple driving manner. One second-type driving unit 320 is electrically connected to one pixel driving circuit row 40 through one second-type signal line 12. That is, the second-type driving unit 310 in embodiments of the present disclosure adopts one-driving-one driving manner.

As shown in FIG. 11, the display panel further includes a light-emitting control circuit EM_V, a first scanning control circuit SN1_V, a second scanning control circuit SP_V, a third scanning control circuit SN2_V, and a fourth scanning control circuit SP*_V. The light-emitting control circuit EM_V is electrically connected to the light-emitting control signal line EM. The first scanning control circuit SN1_V is electrically connected to the first scanning control signal line SN1. The second scanning control circuit SP_V is electrically connected to the second scanning control signal line SP. The third scanning control circuit SN2_V is electrically connected to the third scanning control signal line SN2. The fourth scanning control circuit SP*_V is electrically to the fourth scanning control signal line SP*.

In some embodiments of the present disclosure, the first-type signal lines 11 include at least one of the light-emitting control signal line EM, the first scanning control signal line SN1, the third scanning control signal line SN2, or the fourth scanning control signal line SP*. Accordingly, as shown in FIG. 11, the first-type driving circuit 31 includes at least one of the light-emitting control circuit EM_V, the first scanning control circuit SN1_V, the third scanning control circuit SN2_V, or the fourth scanning control circuit SP*_V. The control signal line 121 includes the second scanning control signal line SP. Accordingly, as shown in FIG. 11, the second-type driving circuit 32 includes the second scanning control circuit SP_V. That is, in embodiments of the present disclosure, at least one of the light-emitting control signal line EM, the first scanning control signal line SN1, the third scanning control signal line SN2, or the fourth scanning control signal line SP* is not broken by any functional component region DA, and the second scanning control signal line SP is broken by one of the functional component regions DA.

Figure 13:
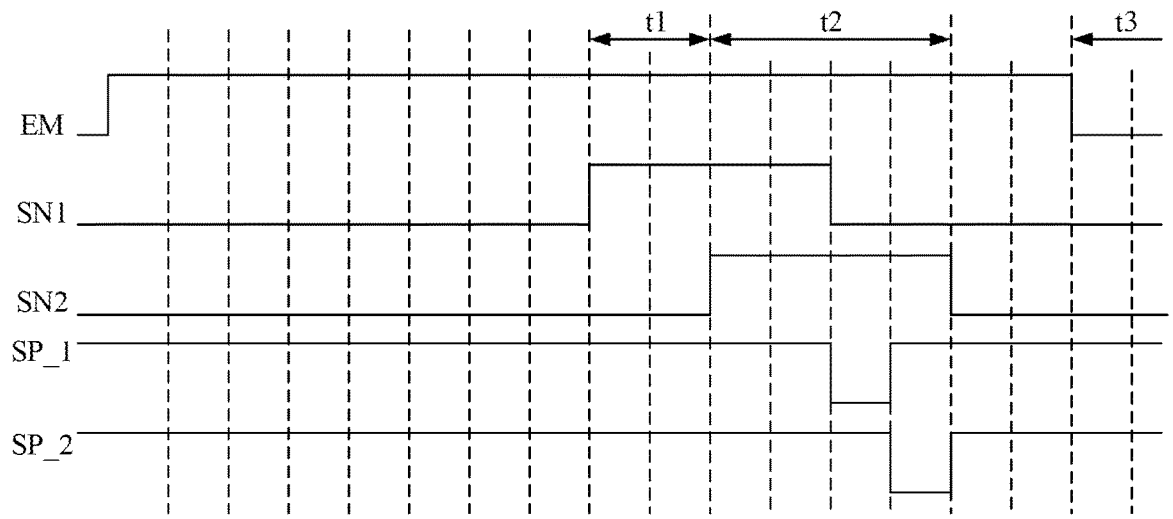
FIG. 13 is a working timing diagram of two pixel driving circuit rows in a pixel driving circuit group according to some embodiments of the present disclosure.

FIG. 13 is a timing diagram of two pixel driving circuit rows in a pixel driving circuit group according to some embodiments of the present disclosure. In an exemplary embodiment, as shown in FIG. 8 and FIG. 13, the two pixel driving circuit rows receive a same emission control signal, a same first scanning control signal, a same third scanning control signal and a same fourth scanning control signal, and the two pixel driving circuit rows are electrically connected to two second scanning drive units respectively. In FIG. 13, EM denotes the signal provided by the light-emitting control signal line electrically connected to the two pixel driving circuit rows, SN1 denotes the signal provided by the first scanning control signal line electrically connected to the two pixel driving circuit rows, SN2 denotes the signal provided by the third scanning control signal line electrically connected to the two pixel driving circuit rows, SP* denotes the signal provided by the fourth scanning control signal line electrically connected to the two pixel driving circuit rows, SP1 denotes the signal provided by the second scanning control signal line electrically connected to one of the two pixel driving circuit rows, and SP2 denotes the signal provided by the second scanning control signal line electrically connected to the other one of the two pixel driving circuit rows. As shown in FIG. 13, both the pulse width of the signal provided by the second scanning control signal line SP_1 and the pulse width of the signal provided by the second scanning control signal line SP_2 are less than the pulse width of the signal provided by the light-emitting control signal line EM; both the pulse width of the signal provided by the second scanning control signal line SP_1 and the pulse width of the signal provided by the second scanning control signal line SP_2 are less than the pulse width of the signal provided by the first scanning control signal line SN_1; both the pulse width of the signal provided by the second scanning control signal line SP_1 and the pulse width of the signal provided by the second scanning control signal line SP_2 are less than the pulse width of the signal provided by the third scanning control signal line SN_2; and both the pulse width of the signal provided by the second scanning control signal line SP_1 and the pulse width of the signal provided by the second scanning control signal line SP_2 are less than the pulse width of the signal provided by the fourth scanning control signal line SP*.

In the embodiments of the present disclosure, the control signal line 121 includes the second scanning control signal line SP. That is, the second scanning control signal line SP is broken at one of the functional component regions DA, and the second scanning control circuits SP_V employ a bilateral driving manner. In the process that the second scanning control signal is transmitted on the second scanning control signal line SP, the attenuation of the second scanning control signal transmitted on the second scanning control signal line SP is reduced, and the second scanning control signal having a smaller pulse width and transmitted on the second scanning control signal line SP can be accurately outputted.

In an exemplary embodiment, as shown in FIG. 12, the display panel further includes at least one first one joint line 51. The first-type signal lines 11 that transmit the same signal and are electrically connected to at least two pixel driving circuit rows 40 in a same pixel driving circuit group 4 are electrically connected to a same first jointing line 51, and the first jointing line 51 is electrically connected to the first-type connecting lines 101 arranged corresponding to the functional component region DA.

Specifically, the configuration where the first-type signal lines 11 that transmit the same signal and are electrically connected to at least two pixel driving circuit rows 40 in the same pixel driving circuit group 4 are electrically connected to the same first jointing line 51 is as follows. The light-emitting control signal lines EM that are electrically connected to at least two pixel driving circuit rows 40 in the same pixel driving circuit group 4 are electrically connected to the same first jointing line 51; the first scanning control signal lines SN1 that are electrically connected to at least two pixel driving circuit rows 40 in the same pixel driving circuit group 4 are electrically connected to the same first jointing line 51; the third scanning control signal lines SN2 that are electrically connected to at least two pixel driving circuit rows 40 in the same pixel driving circuit group 4 are electrically connected to the same first jointing line 51; and the fourth scanning control signal lines SP* that are electrically connected to at least two pixel driving circuit rows 40 in the same pixel driving circuit group 4 are electrically connected to the same first jointing line 51.

With such configuration, the quantity of the first-type connecting lines 101 can be reduced. If the first-type connecting lines 101 are disposed in the first non-display region NA1, it is beneficial to reduce the width of the first non-display region NA1. If the first-type connecting lines 101 are disposed in the display region AA, it is beneficial to reduce the mutual interference between the signal transmitted by the first-type connecting lines 101 and other type signals transmitted in the display region AA. FIG. 11 and FIG. 12 illustrate an example that one pixel driving circuit group 4 includes two pixel driving circuit rows 40.

Figure 14:
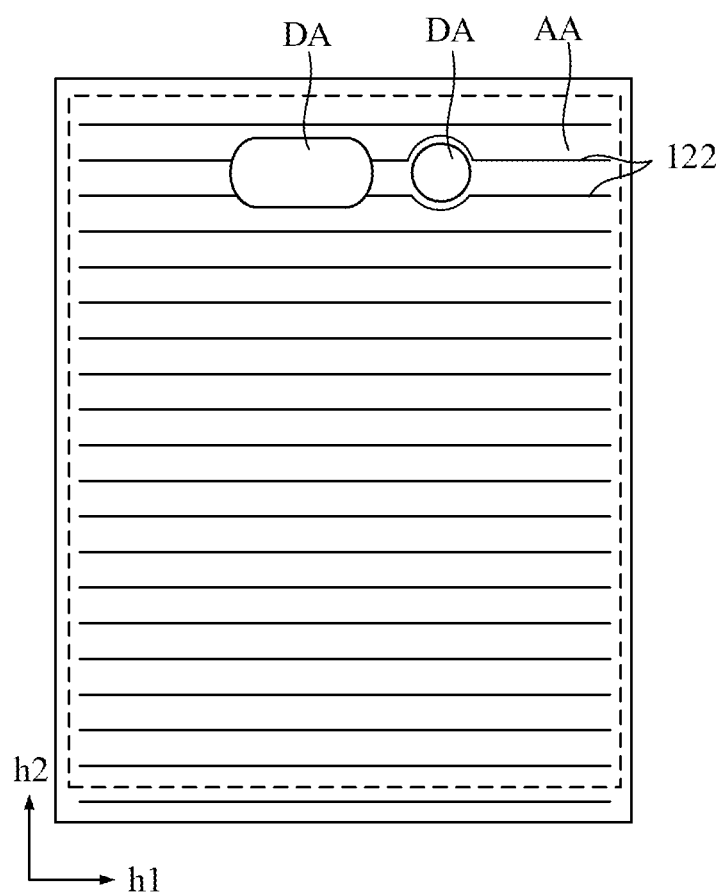
FIG. 14 is a schematic diagram of functional signal lines according to some embodiments of the present disclosure.

In some embodiments, the second-type signal lines 12 include functional signal lines, and the functional signal lines are configured to transmit a constant signal. The functional signal line refers to a signal line that is electrically connected to the input terminal of at least one transistor in the pixel driving circuit 400. FIG. 14 is a schematic diagram of functional signal lines 122 according to some embodiments of the present disclosure. Exemplarily, as shown in FIG. 14, at least one part of each of the functional signal lines 122 extends in the first direction h1, and at least one functional signal line 122 of the functional signal lines 122 is broken at one functional component region DA. In some embodiments, the display panel includes a functional signal connecting line (not shown) extending in the second direction h2 for connecting two parts of the functional component region DA that are broken by the functional component region DA. In some embodiments, the functional signal connect lines (not shown) are respectively arranged in the non-display regions that are located at two sides of the display region AA.

In an exemplary embodiment, the functional signal line 122 includes the first reset signal line Ref1. That is, in the present embodiment, the first reset signal line Ref1 is broken at two sides of at least one functional component region DA. In the present embodiment, with the first reset signal line Ref1 being broken at two sides of one of the functional component regions DA, it is avoided that too many connecting lines are disposed in the periphery of this functional component region DA, and is beneficial to reduce the width of the first non-display region NA1 in the periphery of this functional component region DA.

Exemplarily, the functional signal line 122 includes the second reset signal line Ref2. That is, in the present embodiment, the second reset signal line Ref2 is broken at two sides of one of the functional component regions DA.

Figure 15:
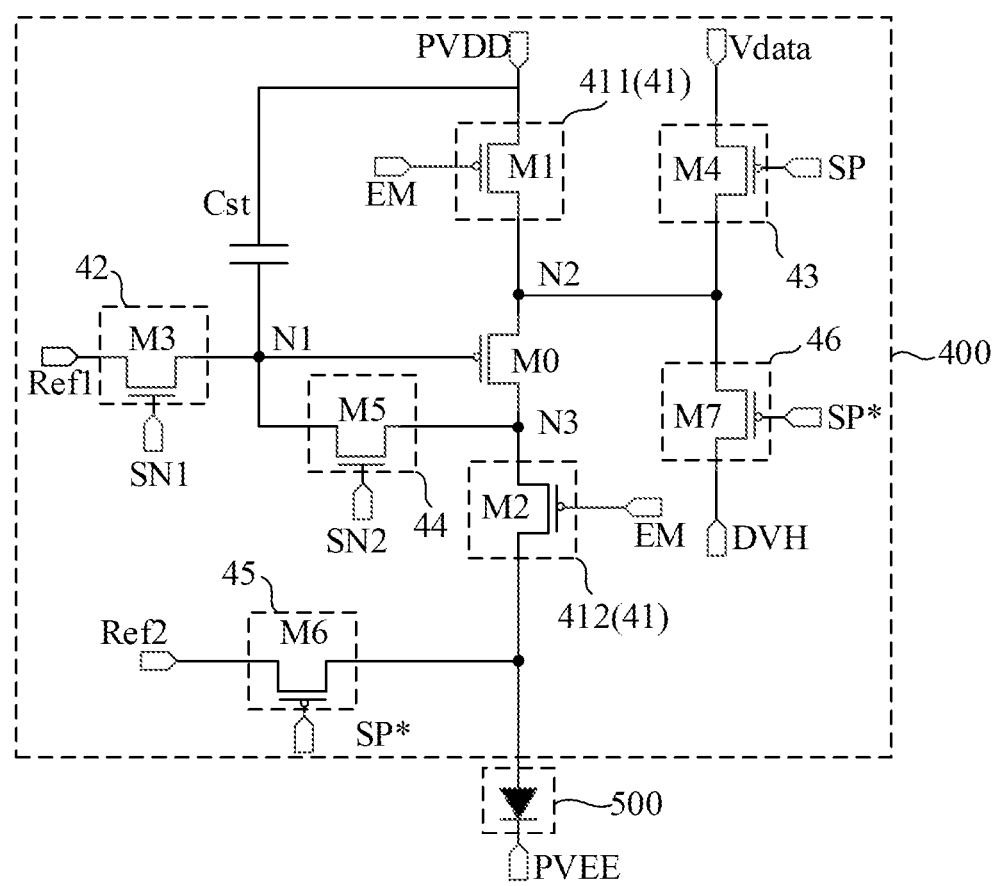
FIG. 15 is a schematic diagram of another pixel driving circuit according to some embodiments of the present disclosure.

FIG. 15 is a schematic diagram of another pixel driving circuit according to some embodiments of the present disclosure. In an exemplary embodiment, as shown in FIG. 15, the pixel driving circuit 400 includes a bias adjusting circuit 46, and the bias adjusting circuit 46 is electrically connected to the fourth scanning control signal line SP* and an signal adjusting line DVH. Exemplarily, as shown in FIG. 15, the bias adjusting circuit 46 includes a sixth transistor M6, a gate of the sixth transistor M6 is electrically connected to the fourth scanning control signal line SP*, a first electrode of the sixth transistor M6 is electrically connected to the signal adjusting line DVH, and a second electrode of the sixth transistor M6 is electrically connected to the first electrode of the driving transistor M0.

Figure 16:
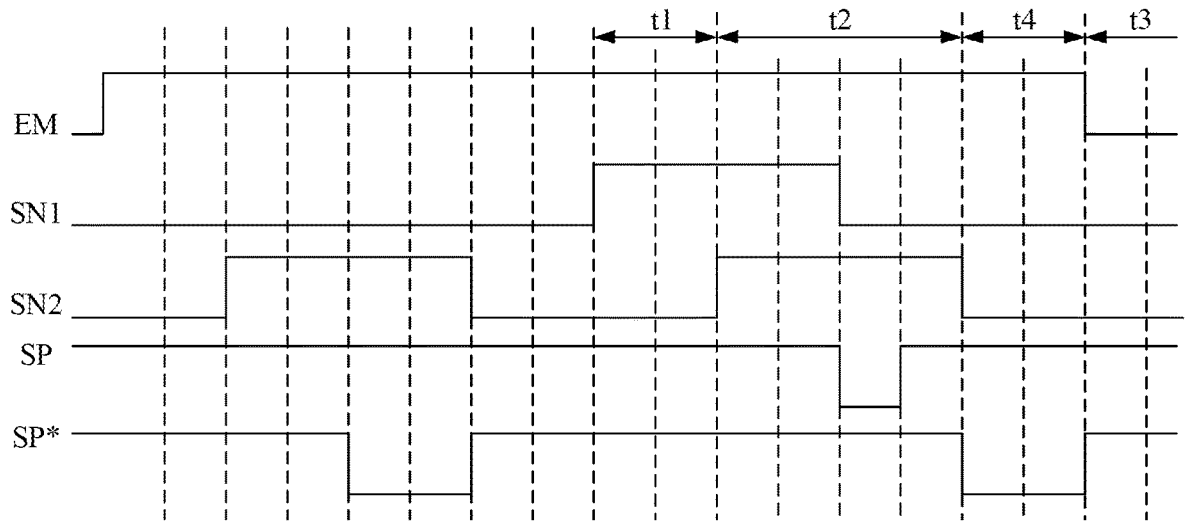
FIG. 16 is a working timing diagram of the pixel driving circuit shown in FIG. 15.

FIG. 16 is a working timing diagram of the pixel driving circuit shown in FIG. 15. As shown in FIG. 15 and FIG. 16, the working process of the pixel driving circuit includes a reset phase t1, a charging phase t2, a light-emitting phase t3, and an adjusting phase t4. The adjusting phase t4 is between the charging phase t2 and the light-emitting t3. During the adjusting phase t4, the fourth scanning control signal line SP* controls the sixth transistor M6 to be turned on, a bias voltage provided by the signal adjusting line DVH is inputted to the first electrode of the driving transistor M0 through the sixth transistor M6, and a bias state of the driving transistor M0 is adjusted by the bias voltage.

In an exemplary embodiment, the functional signal line 122 includes the signal adjusting line DVH. That is, in the present embodiment, the signal adjusting line DVH is broken at two sides of one of the functional component regions DA. With such configuration, the quantity of the connecting lines arranged in the peripheries of the functional component regions DA for connecting the signal adjusting line DVH is reduced, which is beneficial to reducing the width of the first non-display regions NA1 located at two sides of the functional component region DA.

It should be noted that FIG. 15 merely illustrates an exemplary embodiment in which the light-emitting element reset circuit 45 and the bias adjusting circuit 46 are both electrically connected to the fourth scanning control signal line SP*. In another embodiment, the adjusting phase t4 is between the charging phase t2 and the light-emitting phase t3, the light-emitting element is reset before the light-emitting phase t3, the light-emitting element reset circuit 45 and the bias adjusting circuit 46 may be electrically connected to another different signal line. For example, in one embodiment, the sixth transistor M6 and the third transistor M3 are in the same type, and the sixth transistor M6 and the third transistor M3 are both electrically connected to the first scanning control signal line SN1, which is not limited in embodiments of the present disclosure.

Figure 17:
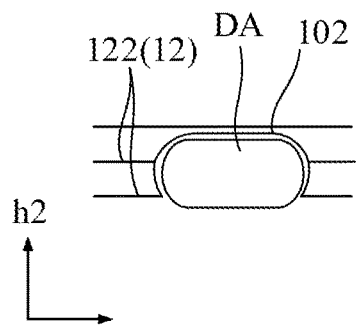
FIG. 17 is a schematic diagram illustrating a partial region of yet another display panel according to some embodiments of the present disclosure.

Exemplarily, the second-type signal lines 12 include N functional signal lines 122. In embodiments of the present disclosure, the N functional signal lines 122 are electrically connected to M second-type connecting lines 102, where 1≤M≤N, M and N are integers. FIG. 17 is a schematic diagram illustrating a partial region of yet another display panel according to some embodiments of the present disclosure. In the exemplary embodiment shown in FIG. 17, M=1, and N=2. That is, the display panel includes two functional signal lines 122 arranged corresponding to the functional component region DA, and the two functional signal lines 122 are electrically connected to each other by one second-type connecting line 102. With such configuration, the quantity of the connecting line arranged in the periphery of the functional component region DA is reduced, and the width of the first non-display region NA1 in the periphery of the functional component region DA is reduced.

Figure 18:
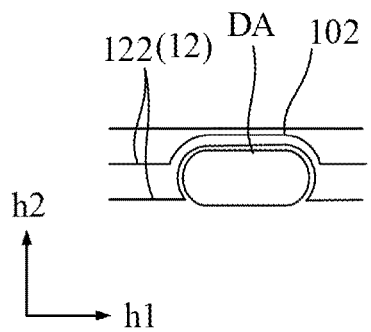
FIG. 18 is a schematic diagram illustrating a partial region of yet another display panel according to some embodiments of the present disclosure.

FIG. 18 is a schematic diagram illustrating a partial region of yet another display panel according to some embodiments of the present disclosure. In an alternative embodiment, as shown in FIG. 18, M=N=2. That is, the display panel includes two functional signal lines 122 arranged corresponding to the functional component region DA, and two parts of each of the two functional signal lines 122 located at two sides of the functional component region DA are electrically connected by a respective one of the two second-type connecting lines 102. With such configuration, more connecting lines are provided for the functional signal lines 122 that are broken at the functional component region DA, and two parts of each functional signal line 122 at two sides of the functional component region DA in the first direction h1 are electrically connected by connecting line, which is s beneficial to reducing the signal attenuation of the functional signal during transmission.

Figure 19:
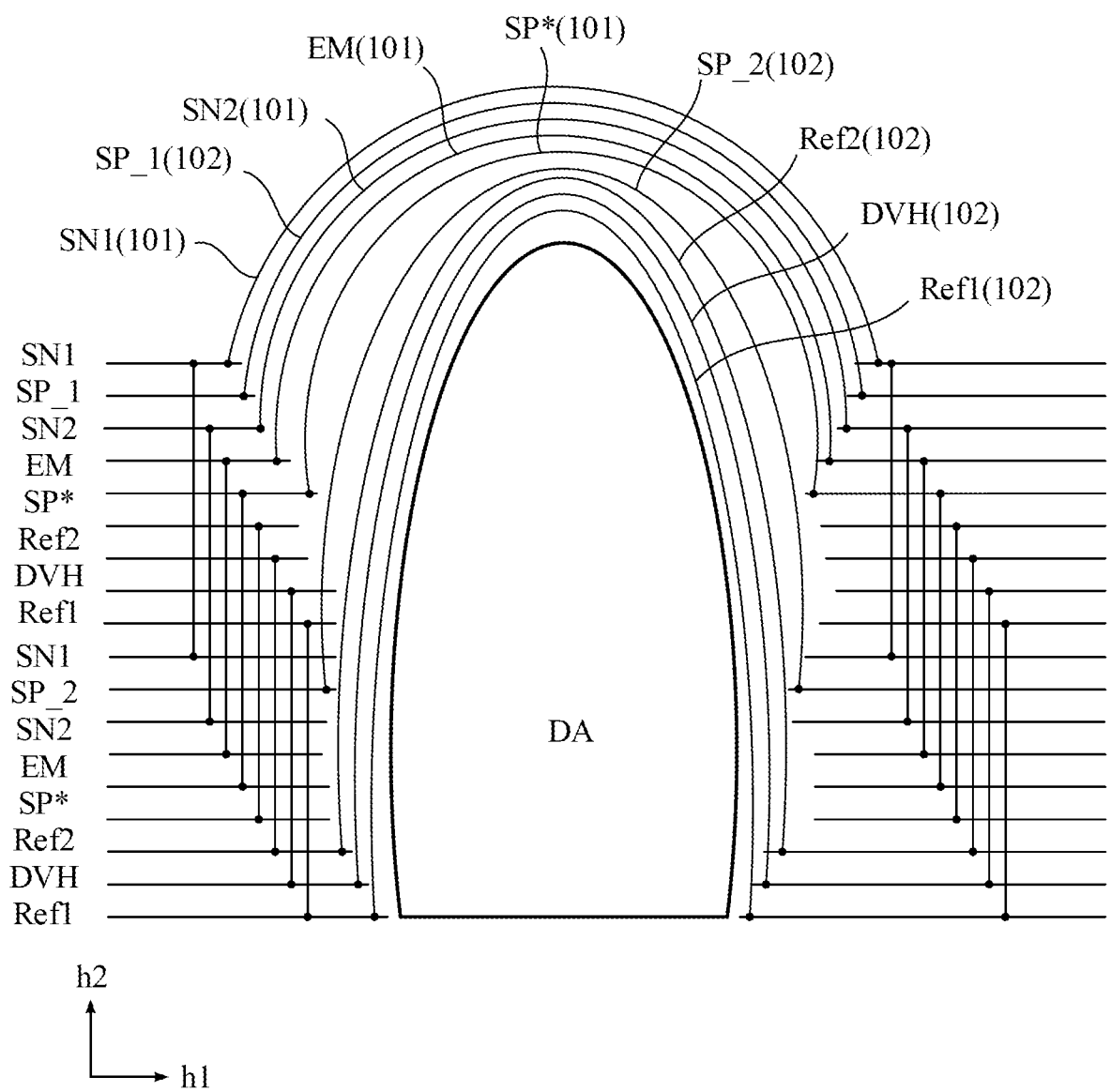
FIG. 19 is a schematic diagram illustrating a partial region of yet another display panel according to some embodiments of the present disclosure.

The first-type signal lines 11 may include the light-emitting control signal line EM, the first scanning control signal line SN1, the third scanning control signal line SN2, and the fourth scanning control signal line SP*. FIG. 19 is a schematic diagram illustrating a partial region of yet another display panel according to some embodiments of the present disclosure. In an exemplary embodiment, as shown in FIG. 19, the first scanning control signal line SN1, the third scanning control signal line SN2, the third scanning control signal line SN3, the light-emitting control signal line EM, the fourth scanning control signal line SP*, the second reset signal line Ref2, the signal adjusting line DVH, and the first reset signal line Ref1 are sequentially arranged in the second direction h2.

Figure 20:
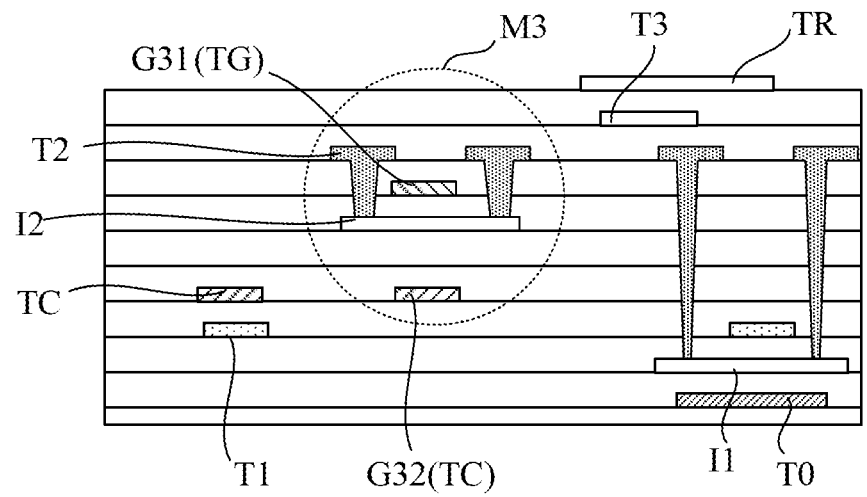
FIG. 20 is a sectional schematic view of a third transistor and a fifth transistor in the pixel driving circuit shown in FIG. 8 and FIG. 15.

FIG. 20 is a sectional schematic view of the display panel according to some embodiments of the present disclosure. In an exemplary embodiment, as shown in FIG. 20, the display panel includes a first metal layer TO, a second metal layer T1, a third metal layer TC, a fourth metal layer TG, and a fifth metal layer T2 that are sequentially arranged in the thickness direction of the display panel.

As shown in FIG. 20, the display panel further includes a first semiconductor layer I1 and a second semiconductor layer I2. In some embodiments, the first semiconductor layer I1 includes polysilicon, and the second semiconductor layer I2 includes indium gallium zinc oxide. Exemplarily, as shown in FIG. 20, the third transistor M3 includes a first gate G31 and a second gate G32 arranged in the thickness direction of the display panel. An active layer of the third transistor M3 is located in the second semiconductor layer I2. In the thickness direction of the display panel, the second semiconductor layer I2 is between the first gate G31 and the second gate G32. The double gate configuration of the third transistor M3 including the first gate G31 and the second gate G32 is beneficial to improving the performance of the third transistor M3. Exemplarily, as shown in FIG. 20, the first gate G31 is located in the fourth metal layer TG, and the second gate G32 is located in the third metal layer TC.

Exemplarily, as shown in FIG. 20, the display panel further includes a sixth metal layer T3 and a seventh metal layer TR. Exemplarily, an electrode of the light-emitting element is formed in the seventh metal layer TR.

Figure 21:
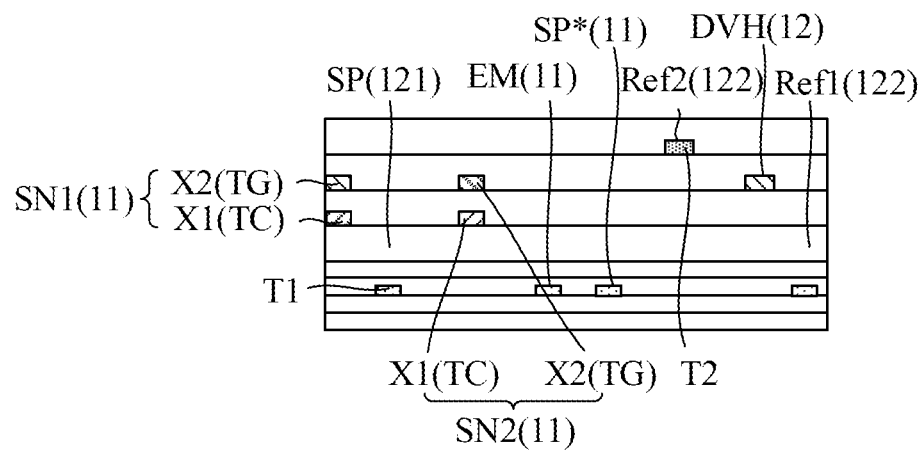
FIG. 21 is a sectional view of a display panel according to some embodiments of the present disclosure.

FIG. 21 is a sectional view of a display panel according to some embodiments of the present disclosure. In some embodiments, as shown in FIG. 21, the first scanning control signal line SN1 includes a first sub-line X1 and a second sub-line X2, the first sub-line X1 is located in the third metal layer TC, and the second sub-line X2 is located in the fourth metal layer TG. The first sub-line X1 is electrically connected to the first gate G31 of the third transistor M3, and the second sub-line X2 is electrically connected to the second gate G32 of the third transistor M3. The first sub-line X1 and the second sub-line X2 are electrically in the non-display region (not shown) on a first side of the display region AA, and another connection of the first sub-line X1 and the second sub-line X2 is in the non-display region (not shown) on a second side of the display region AA. That is, the first sub-line X1 and the second sub-line X2 in the first scanning control signal line SN1 are connected in parallel.

In some embodiments, as shown in FIG. 21, the second scanning control signal line SP is located in the second metal layer T1.

In some embodiments, with reference to FIG. 20, the fifth transistor M5 includes a first electrode G51 and a second electrode G52 that are arranged in the thickness direction of the display panel. In the thickness direction of the display panel, an active layer IS of the fifth transistor M5 is located between the first electrode G51 and the second electrode G52. The double gate configuration of the fifth transistor M3 including the first gate G31 and the second gate G32 is beneficial to improving the performance of the fifth transistor M5. Exemplarily, as shown in FIG. 20, the first gate G51 is located in the fourth metal layer TG, and the second gate G52 is located in the third metal layer TC.

Accordingly, as shown in FIG. 21, the third scanning control signal line SN2 includes a first sub-line X1 and a second sub-line X2 connected in parallel. The first sub-line X1 is located in the third metal layer TC, and the second sub-line X2 is located in the fourth metal layer TG.

In some embodiments, as shown in FIG. 21, the light-emitting control signal line EM, the fourth scanning control signal line SP*, and the first reset signal line Ref1 are located in the second metal layer T1.

In some embodiments, as shown in FIG. 21, the second reset signal line Ref2 is located in the fifth metal layer T2. In some embodiments, the fifth metal layer T2 may include a material with good conductivity. In the present embodiments, the second reset signal line Ref2 is arranged in the fifth metal layer T2, which can reduce the resistance of the second reset signal line Ref2 and is beneficial to the signal transmission on the second reset signal line Ref2. Exemplarily, material of the fifth metal layer T2 includes at least one of molybdenum, titanium, aluminum, or copper. In some embodiments, the fifth metal layer T2 includes titanium aluminum titanium.

Exemplarily, as shown in FIG. 21, the adjust signal line DVH is located in the fourth metal layer TG.

Figure 22:
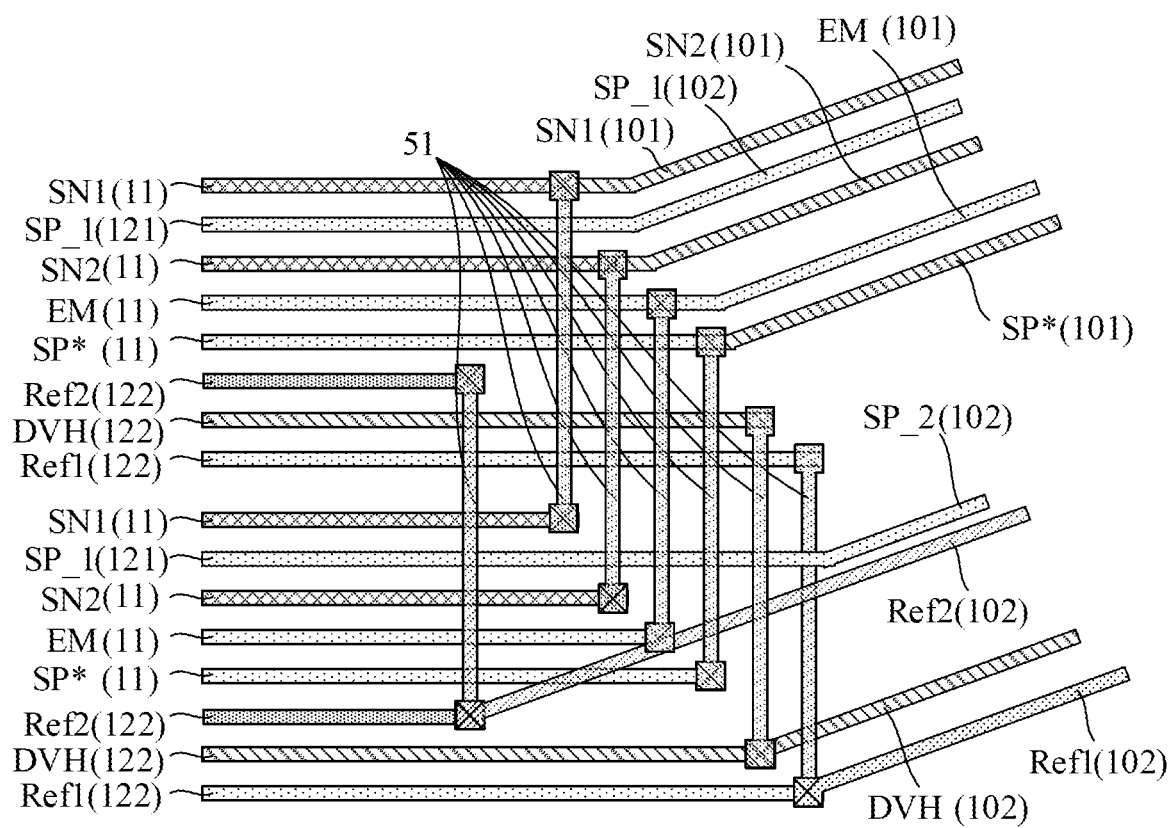
FIG. 22 is an enlarged schematic diagram of a partial region of a display panel according to some embodiments of the present disclosure.

FIG. 22 is an enlarged schematic diagram of a partial region of a display panel according to some embodiments of the present disclosure. The first jointing lines 51 may be arranged in the following manner. In an exemplary embodiment, the first jointing line electrically connected to the first scanning control signal line SN1, the first jointing line electrically connected to the third scanning control signal line SN2, the first jointing line electrically connected to the light-emitting control signal line EM, the first jointing line 51 electrically connected to the fourth scanning control signal line SP*, the first jointing line 51 electrically connected to the signal adjusting line DVH, and the first jointing line 51 electrically connected to the first reset signal line Ref1 are all arranged in the fifth metal layer T2. With such configuration, the resistance of each first jointing line 51 is reduced. In FIG. 22, different filling patterns represent different metal layers.

In an exemplary embodiment, as shown in FIG. 22, the first jointing line 51 electrically connected to the second reset signal line Ref2 is arranged in the first metal layer T0 that is different from the fifth metal layer T2.

Figure 23:
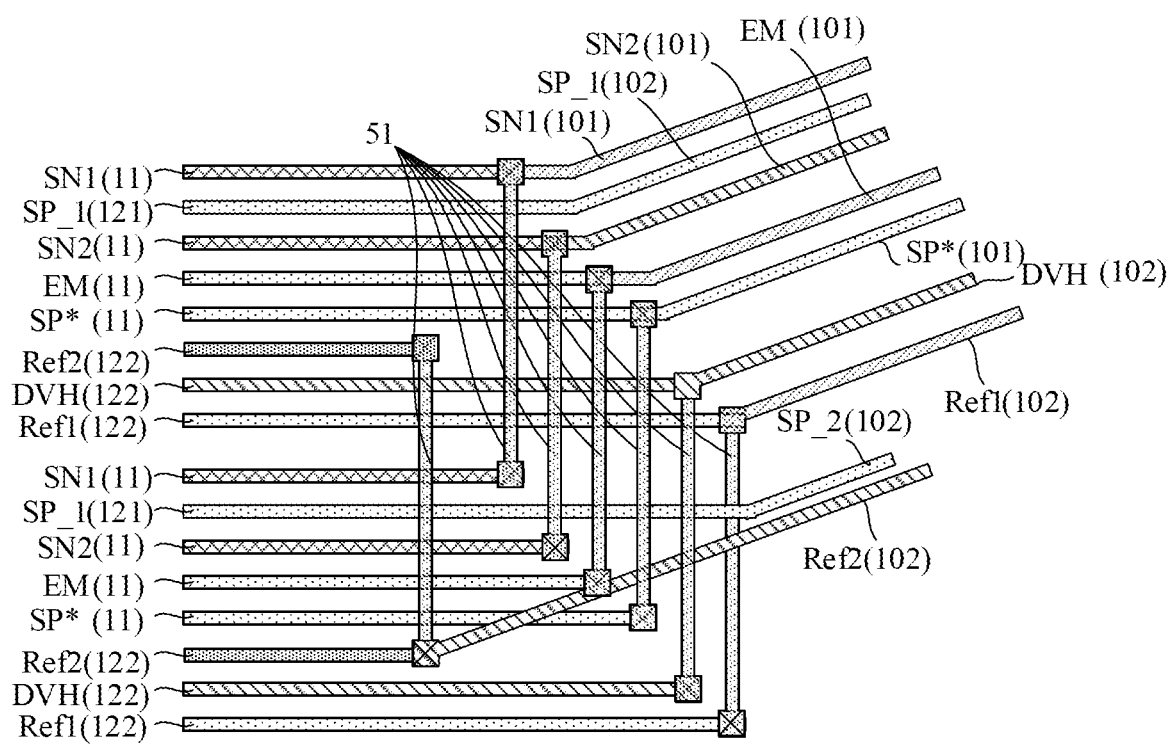
FIG. 23 is an enlarged schematic diagram of a partial region of another display panel according to some embodiments of the present disclosure.

FIG. 23 is an enlarged schematic diagram of a partial region of another display panel according to some embodiments of the present disclosure. In an alternative embodiment, as shown in FIG. 23, the first jointing line 51 electrically connected to the second reset signal line Ref2 is arranged in the fifth metal layer T2 having a good conductivity. That is, the first jointing line 51 electrically connected to the second reset signal line Ref2 is arranged in the same layer as other first jointing lines 51, such that the resistance of the first jointing line 51 electrically connected to the second reset signal line Ref2 is reduced, and the manufacturing process of the display panel is simplified.

In an exemplary embodiment, the second-type connecting lines 102 of the first connecting lines 10 are arranged in the fourth metal layer TG. In an optional embodiment, in the direction perpendicular to the plane of the display panel, the second-type connecting lines 102 may at least partially overlap lines in the second metal layer T1, so as to reduce the space occupied by the connecting lines.

In an exemplary embodiment, in the second direction h2, at least two of the first connecting lines 10 are alternately arranged in at least two metal layers. With such configuration, the pitch between two first connecting lines 10 that are located in different metal layers and transmit different signals can be set smaller while ensuing good insulation of the first connecting lines 10. If the first connecting lines 10 are arranged in the first non-display region NA1 surrounding the functional component are DA, the width of the first non-display region NA1 can be reduced.

In an exemplary embodiment, the width of the first connecting line 10 in one metal layer may be set to 1.6 μm, and the width of the first connecting line 10 in another metal layer may be set to 1.7 μm. The distance between two adjacent first connecting lines 10 located in two metal layers is set to 1.6 μm or 1.5 μm. For example, in the above two metal layers, widths of the alternately arranged first connecting lines 10 are 1.6 μm and 1.7 μm respectively. That is, the first connecting lines with a width of 1.6 μm and the first connecting lines with a width of 1.7 μm are alternately arranged. The interval between two adjacent first connecting lines 10 of the alternately arranged first connecting lines 10 is 1.6 μm or 1.5 μm, that is, the first connecting lines 10 are arranged in such a manner that the interval of 1.6 μm and the interval of 1.5 μm are alternately arranged. The alternately arranged first connecting lines are arranged to have different widths and different intervals, thereby realizing the load uniformity of the signal lines arranged in different layers.

In an optional embodiment, the first-type connecting line 101 corresponding to the first scanning control signal line SN1, the first-type connecting line 101 corresponding to the light-emitting control signal line EM, the first-type connecting line 101 corresponding to the third scanning control signal line SN2, and the first-type connecting line corresponding to the fourth scanning control signal line SP* are arranged in the second metal layer T1 and the third metal layer TC respectively. In an optional embodiment, the first-type connecting line 101 corresponding to the first scanning control signal line SN1, the light-emitting control signal line EM, the first-type connecting line 101 corresponding to the third scanning control signal line SN2, and the first-type connecting line corresponding to the fourth scanning control signal line SP* are alternately arranged in the second metal layer T1 and the third metal layer TC.

In an optional embodiment, the width of the first-type connecting line 101 located in the second metal layer T1 is 1.6 μm, the width of the first-type connecting line 101 located in the third metal layer TC is 1.7 μm, and an interval between an orthographic projection of the first-type connecting line 101 in the second metal layer T1 on the plane of the display panel and an orthographic projection of the adjacent first-type connecting line 101 in the third metal layer TC on the plane of the display panel is 1.6 μm.

Figure 24:
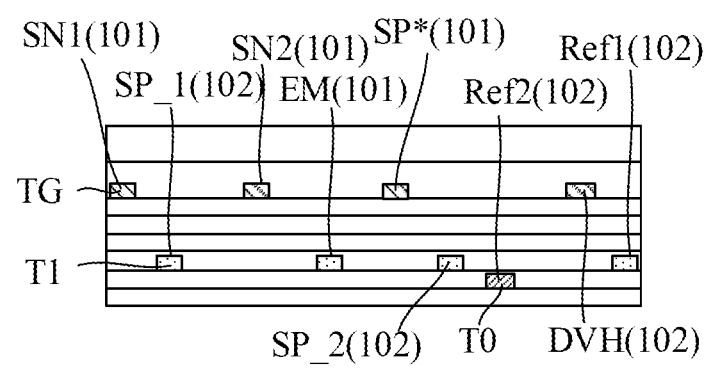
FIG. 24 is a sectional view of a first connecting line according to some embodiments of the present disclosure.

FIG. 24 is a sectional view of a first connecting line according to some embodiments of the present disclosure. In an exemplary embodiment, as shown in FIG. 20 and FIG. 24, the first-type connecting line 101 corresponding to the first scanning control signal line SN1, the second-type connecting line 102 corresponding to one second scanning control signal line SP, the first-type connecting line 101 corresponding to the third scanning control signal line SN2, the first-type connecting line 101 corresponding to the light-emitting control signal line EM, the first-type connecting line 101 corresponding to the fourth scanning control signal line SP*, the second-type connecting line 102 corresponding to another second scanning control signal line SP, the first-type connecting line 101 corresponding to the signal adjusting line DVH, and the first-type connecting line 101 corresponding to the first reset signal line Ref1 are alternately arranged in the fourth metal layer TG and the second metal layer T1. In the direction perpendicular to the plane of the display panel, the distance between the fourth metal layer TG and the second metal layer T1 is relatively large, such that by arranging the various first connecting lines 10 in the two metal layers, the cross talk between the first connecting lines 10 transmitting different signals is reduced.

In an exemplary embodiment, as shown in FIG. 20 and FIG. 24, the second-type connecting line 102 corresponding to the second reset signal line Ref2 is in the first metal layer TO.

Figure 25:
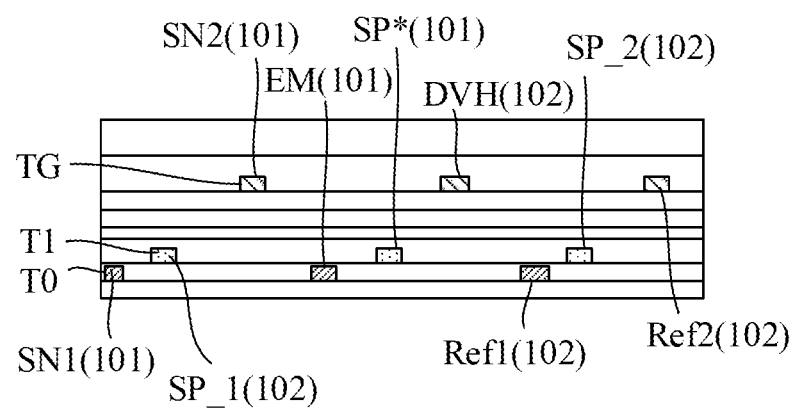
FIG. 25 is a schematic diagram illustrating a partial region of yet another display panel according to some embodiments of the present disclosure.

FIG. 25 is a schematic diagram illustrating a partial region of yet another display panel according to some embodiments of the present disclosure. In an exemplary embodiment, as shown in FIG. 23 and FIG. 25, the first-type connecting line 101 corresponding to the first scanning control signal line SN1, the second-type connecting line 102 corresponding to one second scanning control signal line SP, the first-type connecting line 101 corresponding to the third scanning control signal line SN2, the first-type connecting line 101 corresponding to the light-emitting control signal line EM, the first-type connecting line 101 corresponding to the fourth scanning control signal line SP*, the second-type connecting line 102 corresponding to the signal adjusting line DVH, the second-type connecting line 102 corresponding to the first reset signal line Ref1, the second-type connecting line 102 corresponding to another second scanning control signal line SP, and the second-type connecting line 102 corresponding to the second reset signal line Ref2 are alternately arranged in the first metal layer TO, the second metal layer T1 and the fourth metal layer TG. With such configuration, the space of the three metal layers is fully used, avoiding a large number of connecting lines in the same metal layer. In addition, within a certain space, the distance between two adjacent first connecting lines in the same metal layer can be increased, which is beneficial to reducing crosstalk and reducing the possibility of short circuit.

In an exemplary embodiment, please refer to FIG. 19 again, in the second direction h2, the first-type connecting line 101 corresponding to the first scanning control signal line SN1, the second-type connecting line 102 corresponding to one second scanning control signal line SP_1 electrically connected to the same pixel driving circuit group 4, the first-type connecting line 101 corresponding to the third scanning control signal line SN2, the first-type connecting line 101 corresponding to the light-emitting control signal line EM, the first-type connecting line 101 corresponding to the fourth scanning control signal line SP*, the second-type connecting line 102 corresponding to another second scanning control signal line SP_2 electrically connected to the same pixel driving circuit group 4, the second-type connecting line 102 corresponding to the second reset signal line Ref2, the second-type connecting line 102 corresponding to the signal adjusting line DVH, and the second-type connecting line 102 corresponding to the first reset signal line Ref1 are sequentially arranged.

Figure 26:
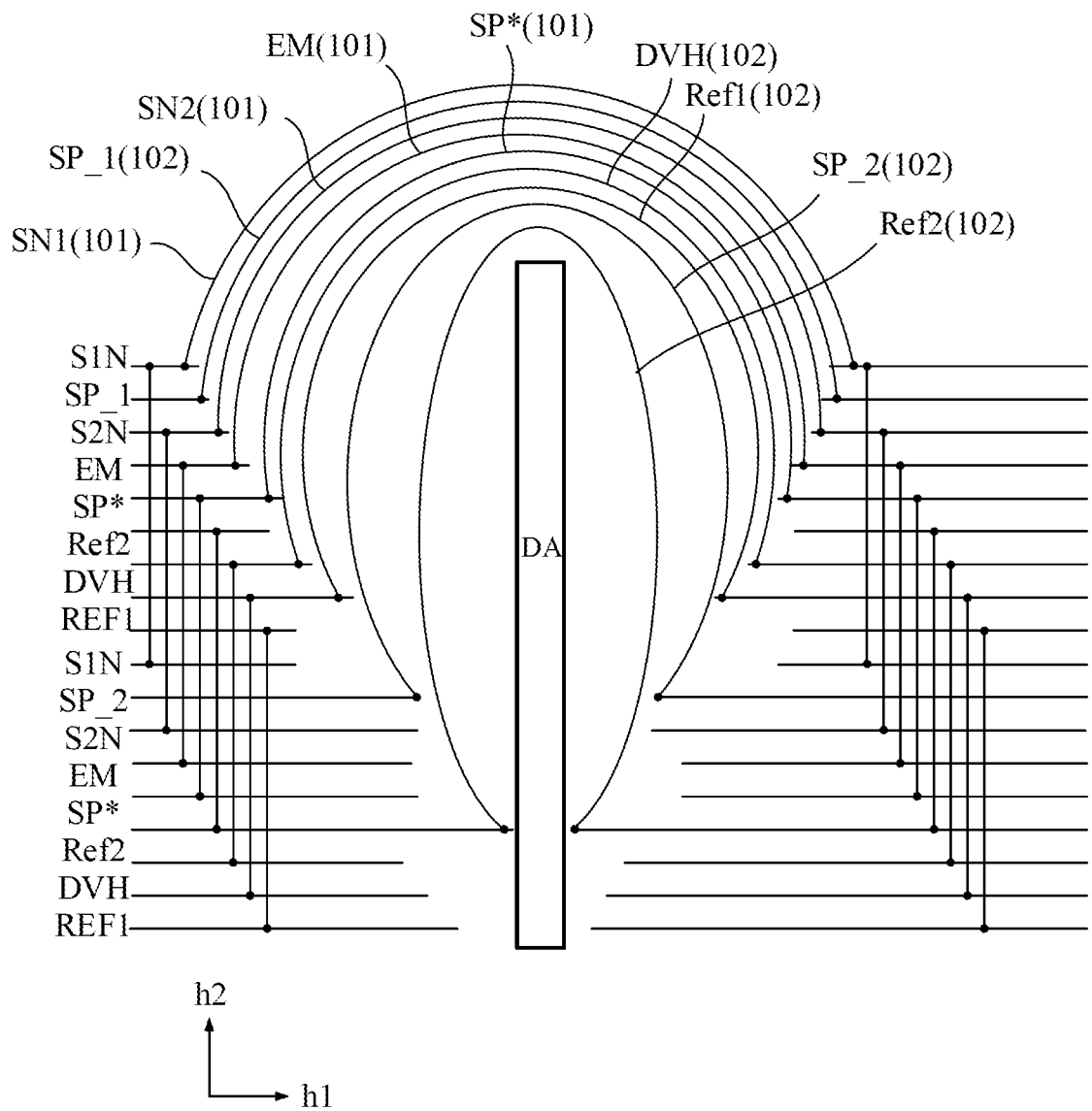
FIG. 26 is a schematic diagram illustrating a partial region of yet another display panel according to some embodiments of the present disclosure.

FIG. 26 is a schematic diagram illustrating a partial region of yet another display panel according to some embodiments of the present disclosure. In an exemplary embodiment, as shown in FIG. 26, the first-type connecting line 101 corresponding to the first scanning control signal line SN1, the second-type connecting line 102 corresponding to one second scanning control signal line SP_1 electrically connected to the same pixel driving circuit group 4, the first-type connecting line 101 corresponding to the third scanning control signal line SN2, the first-type connecting line 101 corresponding to the light-emitting control signal line EM, the first-type connecting line 101 corresponding to the fourth scanning control signal line SP*, the second-type connecting line 102 corresponding to the signal adjusting line DVH, the second-type connecting line 102 corresponding to the first reset signal line Ref1, the second-type connecting line 102 corresponding to another second scanning control signal line SP_2 electrically connected to the same pixel driving circuit group 4, and the second-type connecting line 102 corresponding to the second reset signal line Ref2 are sequentially arranged.

In an exemplary embodiment, please refer to FIG. 11 again, the first-type driving circuit 31 includes a first-side driving circuit 311 and a second-side driving circuit 312. In the first direction h1, the display region AA is located between the first-side driving circuit 311 and the second-side driving circuit 312. At least one first-type signal line 11 is electrically connected to the first-side driving circuit 311, and another at least one first-type signal line 11 is electrically connected to the second-side driving circuit 312.

In some exemplary embodiments, as shown in FIG. 11, the first-side driving circuit 311 includes a first scanning control circuit SN1_V and a light-emitting control circuit EM_V. The first scanning control circuit SN1_V is electrically connected to the first scanning control signal line SN1. The light-emitting control circuit EM_V is electrically connected to the light-emitting control signal line EM.

The second-side driving circuit 312 includes a third scanning control circuit SN2_V and a fourth scanning control circuit SP*_V. The third scanning control circuit SN2_V is electrically connected to the third scanning control signal line SN2. The fourth scanning control circuit SP*_V is electrically connected to the fourth scanning control signal line SP*.

Figure 27:
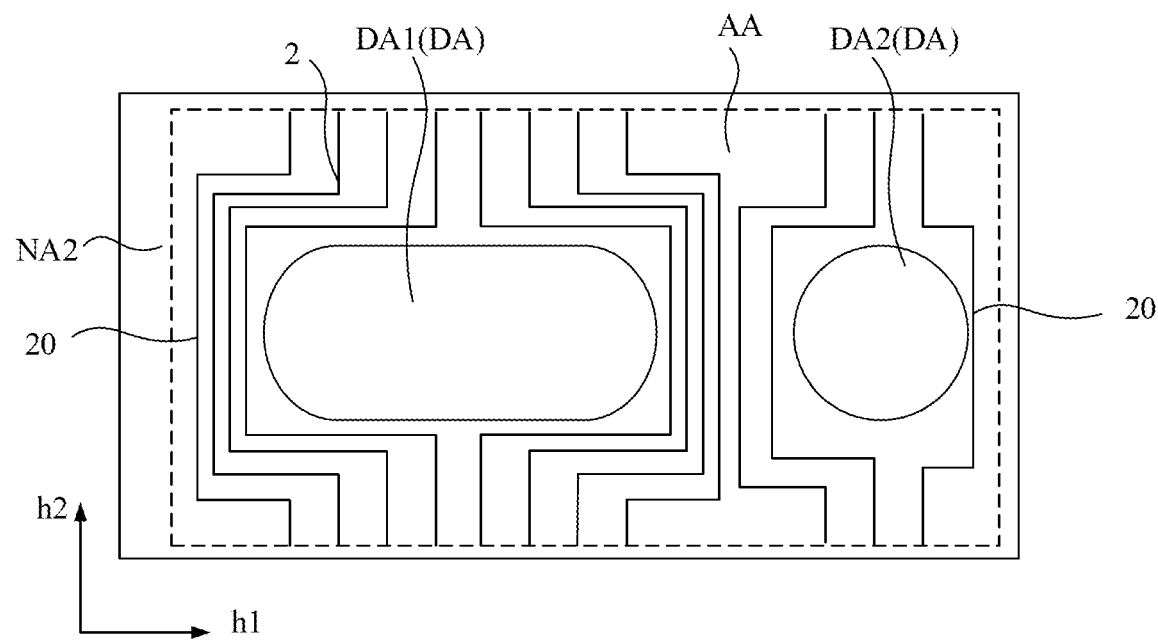
FIG. 27 is a schematic diagram illustrating a partial region of yet another display panel according to some embodiments of the present disclosure.

FIG. 27 is a schematic diagram illustrating a partial region of yet another display panel according to some embodiments of the present disclosure. In an exemplary embodiment, as shown in FIG. 27, the display panel further includes a plurality of second signal lines 2 in the display region AA. At least one part of the second signal line 2 extends in the second direction h2. The second signal lines 2 are arranged in the first direction h1. The second signal line 2 at least partially surrounds the functional component region DA. Exemplarily, the second signal lines 2 include the first power supply voltage line PVDD.

Exemplarily, as shown in FIG. 27, the second signal line 2 includes a second connecting line 20, and the second connecting line 20 connects two parts of the second signal line 2 that are located at two sides of the functional component region DA.

Exemplarily, as shown in FIG. 27, at least one part of the second connecting line 20 is located in the display region AA.

Exemplarily, as shown in FIG. 27, at least one part of the second connecting line 20 is located between the functional component region DA and the second non-display region NA2 that are arranged in the first direction h1, and the second non-display region NA2 at least partially surrounds the display region AA. In other embodiments, at least one part of the second connecting line 20 is located between two adjacent functional component regions DA.

Figure 28:
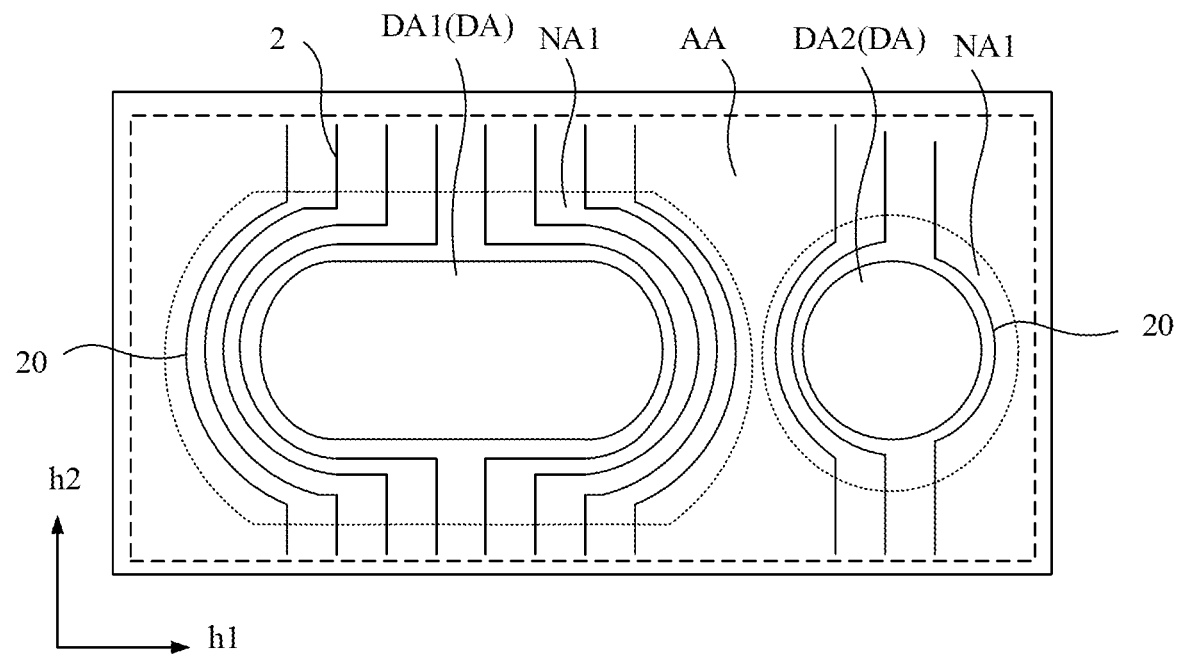
FIG. 28 is a schematic diagram illustrating a partial region of yet another display panel according to some embodiments of the present disclosure.

FIG. 28 is a schematic diagram illustrating a partial region of yet another display panel according to some embodiments of the present disclosure. In some embodiments, as shown in FIG. 28, at least one part of the second signal line 2 is located in the first non-display region NA1 surrounding the functional component region DA. Exemplarily, at least one part of the second connecting line 20 may extend along the edge of the functional component region DA.

Figure 29:
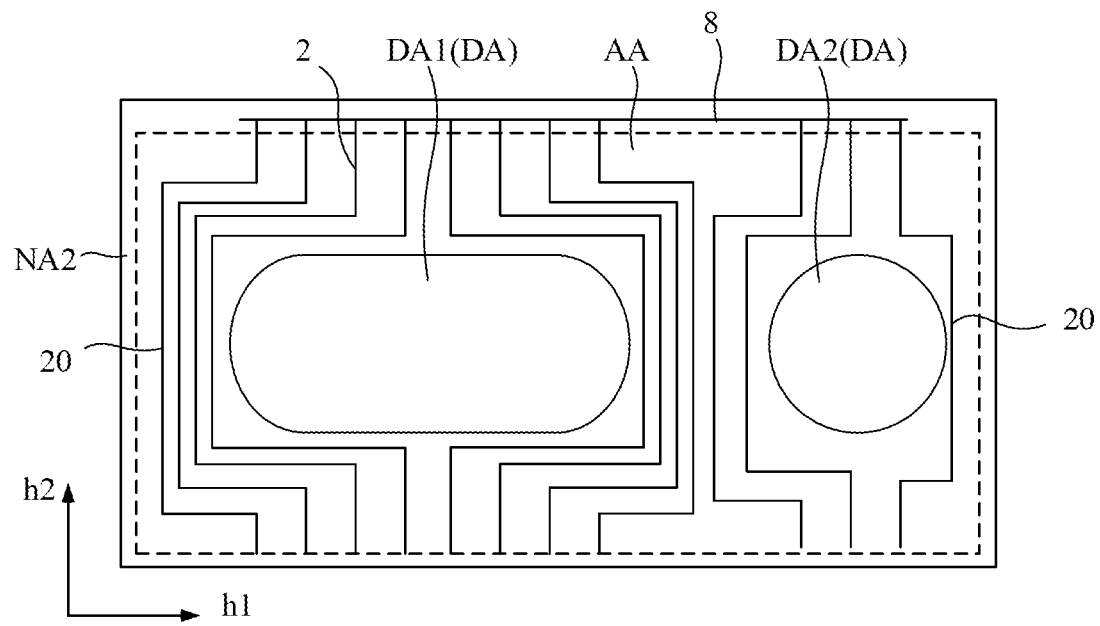
FIG. 29 is a schematic diagram illustrating a partial region of yet another display panel according to some embodiments of the present disclosure.

FIG. 29 is a schematic diagram illustrating a partial region of yet another display panel according to some embodiments of the present disclosure. In some exemplary embodiments, as shown in FIG. 29, the display panel includes a second non-display region NA2 that at least partially surrounds the display region AA. The display panel further includes a connecting bus 8 located in the second non-display region NA2. The connecting bus 8 is electrically connected to multiple second signal lines 2 located in the display region AA.

Figure 30:
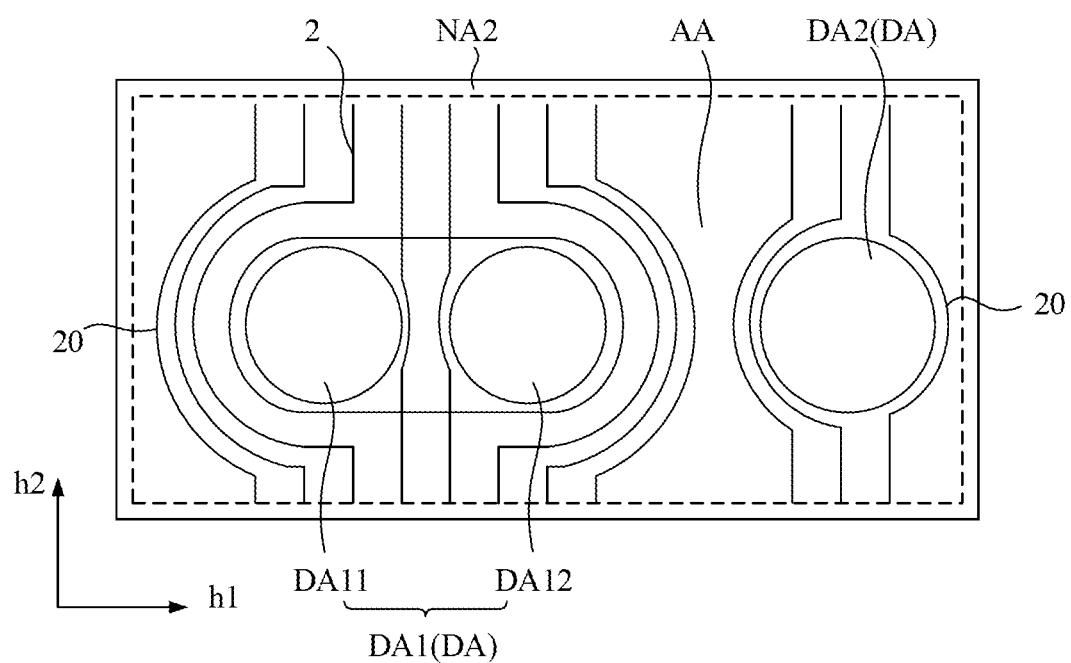
FIG. 30 is a schematic diagram illustrating a partial region of yet another display panel according to some embodiments of the present disclosure.

FIG. 30 is a schematic diagram illustrating a partial region of yet another display panel according to some embodiments of the present disclosure. In some exemplary embodiments, as shown in FIG. 30, one of the functional component regions DA includes a first functional component sub-region DA11 and a second functional component sub-region DA12 that are arranged in the first direction h1. Exemplarily, as shown in FIG. 30, the display panel includes a first functional component regions DA1 and a second functional component regions DA2. In the first direction h1, a length of the first functional component regions DA1 is greater than a length of the second functional component regions DA2. The first functional component regions DA1 can include the first functional component sub-region DA11 and the second functional component sub-region DA12.

In some exemplary embodiments, at least one of the plurality of second signal lines 2 is arranged between the first functional component sub-region DA11 and the second functional component sub-region DA12. In some exemplary embodiments, the second signal line 2 that is located between the first functional component sub-region DA11 and the second functional component sub-region DA12 may extend in the second direction h2. In some exemplary embodiments, the second signal line 2 that is located between the first functional component sub-region DA11 and the second functional component sub-region DA12 may extend in another direction, for example, extend along the edge of the first functional component sub-region DA11 or the second functional component sub-region DA12, which is not limited in embodiments of the present disclosure.

In some exemplary embodiments, an area between the first functional component sub-region DA11 and the second functional component sub-region DA12 is a non-image-display region that is not used for displaying images. In the present embodiment, at least one second signal line 2 has a part extending in the non-image-display region located between the first functional component sub-region DA11 and the second functional component sub-region DA12, such that the non-image-display region can be used reasonably. Such configuration also can reduce the quantity of the second connecting line 20 that is located in the periphery of the first functional component sub-region DA11 and surrounds the first functional component sub-region DA11, and can reduce the difference between the extension length of the second connecting line 20 that is located in the periphery of the first functional component sub-region DA11 and surrounds the first functional component sub-region DA11 and the second connecting line 20 that is located between the first functional component sub-region DA11 and the second functional component sub-region DA12, thereby effectively reducing the load difference between different second connecting lines 20 and improving the load uniformity.

Figure 31:
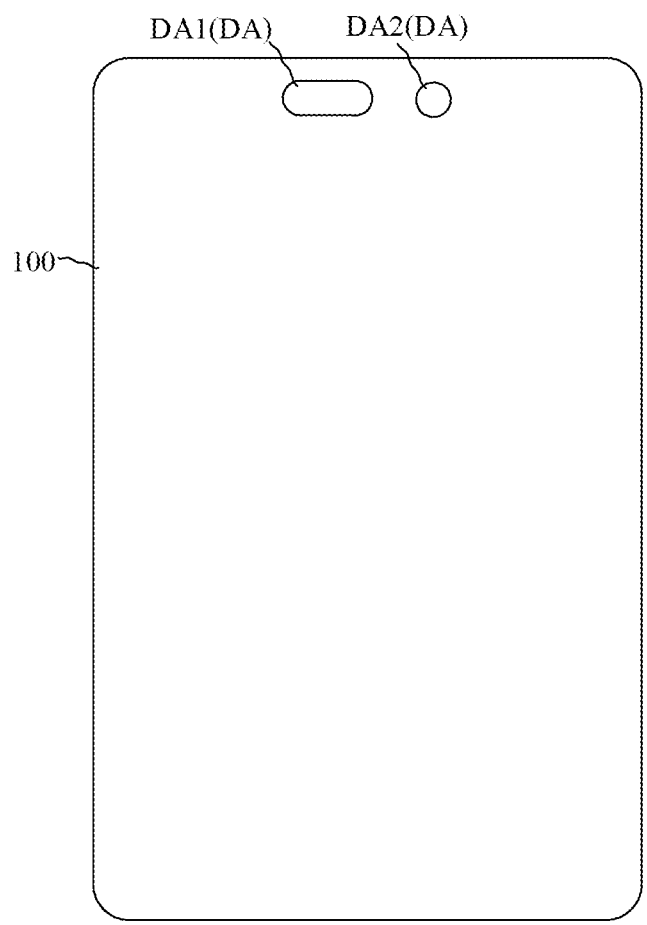
FIG. 31 is a schematic diagram of a display apparatus according to some embodiments of the present disclosure.

Some embodiments of the present disclosure further provides a display apparatus. FIG. 31 is a schematic diagram of a display apparatus according to some embodiments of the present disclosure. As shown in FIG. 31, the display apparatus includes the above display panel 100. A structure of the display panel 100 has been explained in the above embodiment, which will not be repeated herein. The display apparatus shown in FIG. 31 is for exemplary illustration. The display apparatus can be any electrical device with a display function, such as a mobile phone, a tablet computer, a notebook computer, an e-ink book, a television or the like.

Exemplarily, an optical component can be provided in the functional component region DA, and the optical component includes a camera, an iris sensor, and the like.

The above only illustrates some embodiments and does not limit the technical solution of the present disclosure. Any modification, equivalent replacement, improvement, etc. made within the principle of this disclosure shall fall within the scope of disclosure.

What is claimed is:

1. A display panel, wherein the display panel has a display region and at least two functional component regions, wherein the display region at least partially surrounds the at least two functional component regions, and the at least two functional component regions are arranged along a first direction; and wherein the display panel comprises:

first signal lines located in the display region, wherein at least part of each first signal line of the first signal lines extends in a first direction, and the first signal lines are arranged in a second direction intersecting with the first direction, wherein the first signal lines comprise at least one first-type signal line and at least one second-type signal line, wherein one of the at least one first-type signal line at least partially surrounds the at least two functional component regions, and at least one of the at least one second-type signal line is broken at two sides of one functional component region of the at least two functional component regions in the first direction;

wherein the display panel has a dummy line extending in the second direction and comprises a first edge and a second edge that are opposite to each other in the first direction, wherein a distance d1 between the first edge and the dummy line and a distance d2 between the second edge and the dummy line satisfy $0.9 \leq d1/d2 \leq 1.1$, and wherein the at least two functional component regions comprise a first functional component region and a second functional component region, wherein the dummy line passes through the first functional component region, and one of the at least one second-type signal line is broken at two sides of the first functional component region in the first direction.

2. The display panel according to claim 1, wherein the at least two functional component regions comprise a first functional component region and a second functional component region, wherein a distance A between the first functional component region and an edge of the display region in the first direction and a length B of the display region in the first direction satisfy $B/4 \leq A \leq B/2$, and wherein one of the at least one second-type signal line is broken at two sides of the first functional component region in the first direction.

3. The display panel according to claim 1, wherein the at least two functional component regions comprise a first functional component region and a second functional component region, wherein a length of the first functional component region in the first direction is greater than a length of the second functional component region in the first direction, and one of the at least one second-type signal line is broken at two sides of the first functional component region in the first direction.

4. The display panel according to claim 1, wherein at least one first signal line of the first signal lines comprises at least one first connecting line, wherein one of the at least one first connecting line electrically connects two parts, which are located at two sides of one functional component region of the at least two functional component regions, of one first signal line of the first signal lines.

5. The display panel according to claim 4, wherein the at least one first connecting line comprises a first-type connecting line and a second-type connecting line, wherein the at least one first-type signal line comprises the first-type connecting line, and the first-type connecting line electrically connects parts of one of the at least one first-type signal line that are located at two sides of one of the at least two functional component regions; and the at least one second-type signal line comprises the second-type connecting line, and the second-type connecting line electrically connects parts of one of the at least one second-type signal line that are located at two sides of one of the at least two functional component regions.

6. The display panel according to claim 4, wherein the display panel further has a first non-display region located between the display region and one of the at least two functional component regions, wherein at least part of one first connecting line of the at least one first connecting line is located in the first non-display region.

7. The display panel according to claim 4, wherein at least part of one first connecting line of the at least one first connecting line is located in the display region.

8. The display panel according to claim 7, wherein one first connecting line of the at least one first connecting line comprises a first segment and a second segment that are electrically connected to each other, wherein the first segment and the second segment extend in different directions.

9. The display panel according to claim 4, wherein the display panel further has a second non-display region located at a side of the display region away from one of the at least two functional component regions; and
wherein at least part of one first connecting line of the at least one first connecting line is located in the second non-display region.

10. The display panel according to claim 4, wherein the first signal lines comprise at least two first signal lines corresponding to the at least two functional component regions, wherein in the second direction, at least two first connecting lines in the at least two first signal lines are located at a same side of the at least two functional component regions.

11. The display panel according to claim 4, wherein the first signal lines comprise at least two first signal lines corresponding to the at least two functional component regions, wherein each of the at least two first signal lines comprises the at least one first connecting line; and in the second direction, one first connecting line of the at least one first connecting line of one first signal line of the at least two first signal lines is located at a first side of one functional component region of the at least two functional component regions, and one first connecting line of the at least one first connecting line of another first signal line of the at least two first signal lines is located at a second side of the one functional component region of the at least two functional component regions.

12. The display panel according to claim 1, wherein the at least one second-type signal line comprises a control signal line, and the display panel further has a second non-display region that at least partially surrounds the display region; and
wherein the display panel further comprises:
a first-type driving circuit located in the second non-display region and electrically connected to one of the at least one first-type signal line and located at a side of the display region in the first direction, and
second-type driving circuits located in the second non-display region and electrically connected to the control signal line and located at two sides of the display region in the first direction.

13. The display panel according to claim 12, wherein the at least one first-type signal line comprises at least one first-type connecting line, wherein one of the at least one first-type connecting line electrically connects parts of one first-type signal line of the at least one first-type signal line that are located at two sides of one of the at least one functional component region;
wherein the display panel further comprises pixel driving circuit groups arranged in the display region along the second direction, wherein each pixel driving circuit group of the pixel driving circuit groups comprises at least two pixel driving circuit rows arranged in the second direction, wherein each pixel driving circuit row of the at least two pixel driving circuit rows comprises pixel driving circuits arranged in the first direction;
wherein the at least one first-type signal line comprises a plurality of first-type signal lines, the first-type driving circuit comprises first-type driving units that are cascaded, wherein one of the first-type driving units is electrically connected to the at least two pixel driving circuit rows in one pixel driving circuit group of the pixel driving circuit groups through at least two first-type signal lines of the plurality of first-type signal lines; and
wherein the display panel further comprises at least one first jointing line, wherein at least two of the plurality of first-type signal lines that are electrically connected to the at least two pixel driving circuit rows in one pixel driving circuit group of the pixel driving circuit groups are electrically connected to one of the at least one first jointing line, and the one of the at least one first jointing line is electrically connected to the at least one first-type connecting line.

14. The display panel according to claim 12, further comprising:
pixel driving circuits located in the display region,
wherein each of the pixel driving circuit comprises:
a driving transistor,
a light-emitting control circuit having a control terminal electrically connected to a light-emitting control signal line,
a gate reset circuit having a control terminal electrically connected to a first scanning control signal line and an input terminal electrically connected to a first reset signal line,
a data input circuit having a control terminal electrically connected to one second scanning control signal line of second scanning control signal lines,
a threshold voltage compensation circuit having a control terminal electrically connected to a third scanning control signal line, and
a light-emitting element reset circuit having a control terminal electrically connected to a fourth scanning control signal line, wherein the at least one first-type signal line comprises at least one of the light-emitting control signal line, the first scanning control signal line, the third scanning control signal line, or the fourth scanning control signal line; and the control signal line comprises the one second scanning control signal line.

15. The display panel according to claim 14, wherein the at least one second-type signal line further comprises a functional signal line, wherein the functional signal line is configured to transmit a constant signal and is electrically connected to an input terminal of the pixel driving circuit.

16. The display panel according to claim 15, wherein the functional signal line comprises the first reset signal line.

17. The display panel according to claim 15, wherein an input terminal of the light-emitting element reset circuit is electrically connected to a second reset signal line, and the functional signal line comprises the second reset signal line.

18. The display panel according to claim 15, wherein the pixel driving circuit further comprises a bias adjusting circuit, wherein the bias adjusting circuit is electrically connected to the fourth scanning control signal and a signal adjusting line, and the functional signal line comprises the signal adjusting line.

19. The display panel according to claim 15, wherein the at least one second-type signal line comprises N functional signal lines electrically connected to M second-type connecting lines of the at least one second-type connecting line, respectively, where 1≤M≤N, and N and M are integers.

20. The display panel according to claim 14, wherein an input terminal of the light-emitting element reset circuit is electrically connected to a second reset signal line;
wherein the pixel driving circuit further comprises a bias adjusting circuit, wherein the bias adjusting circuit is electrically connected to the fourth scanning control signal and a signal adjusting line;
wherein the at least one first-type signal line comprises the light-emitting control signal line, the first scanning control signal line, the third scanning control signal line, and the fourth scanning control signal line; and
wherein, in the second direction, the first scanning control signal line, the one second scanning control signal line, the third scanning control signal line, the light-emitting control signal line, the fourth scanning control signal line, the second reset signal line, the signal adjusting line, and the first rest signal line are sequentially arranged.

21. The display panel according to claim 14, further comprising:
a first metal layer, a second metal layer, a third metal layer, a fourth metal layer, and a fifth metal layer that are sequentially stacked in a thickness direction of the display panel,
wherein the first scanning control signal line comprises a first sub-line and a second sub-line that are connected in parallel, wherein the first sub-line of the first scanning control signal line is located in the third metal layer, and the second sub-line of the first scanning control signal line is located in the fourth metal layer;
wherein the one second scanning control signal line is located in the second metal layer;
wherein the third scanning control signal line comprises a first sub-line and a second sub-line that are connected in parallel, wherein the first sub-line of the third scanning control signal line is located in the third metal layer, and the second sub-line of the third scanning control signal line is located in the fourth metal layer;
wherein the light-emitting control signal line is located in the second metal layer;
wherein the fourth scanning control signal line is located in the second metal layer; and
wherein the first reset signal line is located in the second metal layer.

22. The display panel according to claim 21, wherein the light-emitting element reset circuit is electrically connected to a second reset signal line, wherein the pixel driving circuit further comprises a bias adjusting circuit, wherein the bias adjusting circuit is electrically connected to the fourth scanning control signal line and a signal adjusting line; and
wherein the second reset signal line is located in the fifth metal layer, and the signal adjusting line is located in the fourth metal layer.

23. The display panel according to claim 22, wherein the at least one first-type signal line comprises a plurality of first-type signal lines, and each of at least one of the plurality of first-type signal lines comprises at least one first-type connecting line, wherein each of the at least one first-type connecting line electrically connects parts of one of the plurality of first-type signal lines that are located at two sides of one of the at least two functional component regions;
wherein the display panel comprises pixel driving circuit groups arranged in the display region along the second direction, each pixel driving circuit group of the pixel driving circuit groups comprises at least two pixel driving circuit rows arranged in the second direction, and each pixel driving circuit row of the at least two pixel driving circuit rows comprises pixel driving circuits arranged in the first direction;
wherein the first-type driving circuit comprises first-type driving units that are cascaded, wherein one of the first-type driving units is electrically connected to the at least two pixel driving circuit rows in one pixel driving circuit group of the pixel driving circuit groups through at least two first-type signal lines of the plurality of first-type signal lines;
wherein the display panel further comprises first jointing lines, wherein the at least two first-type signal lines are electrically connected to one of the first jointing lines, and one of the first jointing lines is electrically connected to the at least one first-type connecting line; and
wherein one of the first jointing lines that is electrically connected to the first scanning control signal line, one of the first jointing lines that is electrically connected to the third scanning control signal line, one of the first jointing lines that is electrically connected to the light-emitting control signal line, one of the first jointing lines that is electrically connected to the fourth scanning control signal line, one of the first jointing lines that is electrically connected to the signal adjusting line, and one of the first jointing lines that is electrically connected to the first reset signal line are all located in the fifth metal layer.

24. The display panel according to claim 23, wherein the one of the first jointing lines that is electrically connected to the second rest signal line is located in the first metal layer.

25. The display panel according to claim 23, wherein the one of the first jointing lines that is electrically connected to the second rest signal line is located in the fifth metal layer.

26. The display panel according to claim 22, wherein the first signal lines comprises first connecting lines, wherein one of the first connecting lines electrically connects two parts, which are located at two sides of one functional component region of the at least two functional component regions, of one first signal line of the first signal lines; and wherein in the second direction, at least two of the first connecting lines are alternately arranged in at least two of the first metal layer, the second metal layer, the third metal layer, the fourth metal layer, or the fifth metal layer.

27. The display panel according to claim 26, wherein the first connecting lines comprise first-type connecting lines and second-type connecting lines; and wherein one of the first-type connecting lines that corresponds to the first scanning control signal line, one of the second-type connecting lines that corresponds to the one second scanning control signal line of the second scanning control signal lines, one of the first-type connecting lines that corresponds to the third scanning control signal line, one of the first-type connecting lines that corresponds to the light-emitting control signal line, one of the first-type connecting lines that corresponds to the fourth scanning control signal line, one of the second-type connecting lines that corresponds to another one second scanning control signal line of the second scanning control signal lines, one of the first-type connecting lines that corresponds to the signal adjusting line, and one of the first-type connecting lines that corresponds to the first reset signal line are alternately arranged in the fourth metal layer and the second metal layer.

28. The display panel according to claim 27, wherein one of the second-type connecting lines that corresponds to the second reset signal line is located in the first metal layer.

29. The display panel according to claim 26, wherein the first connecting lines comprise first-type connecting lines and second-type connecting lines; and wherein one of the first-type connecting lines that corresponds to the first scanning control signal line, one of the second-type connecting lines that corresponds to the one second scanning control signal line of the second scanning control signal lines, one of the first-type connecting lines that corresponds to the third scanning control signal line, one of the first-type connecting lines that corresponds to the light-emitting control signal line, one of the first-type connecting lines that corresponds to the fourth scanning control signal line, one of the second-type connecting lines that corresponds to the signal adjusting line, one of the second-type connecting lines that corresponds to the first reset signal line, one of the second-type connecting lines that corresponds to another second scanning control signal line of the second scanning control signal lines, and one of the second-type connecting line that corresponds to the second reset signal line are alternately arranged in the first metal layer, the second metal layer, and the fourth metal layer.

30. The display panel according to claim 27, wherein one first connecting line of the first connecting lines that is located in one of the first metal layer, the second metal layer, the third metal layer, the fourth metal layer, or the fifth metal layer has a width of 1.6 μm, and another first connecting line of the first connecting lines that is located in another one of the first metal layer, the second metal layer, the third metal layer, the fourth metal layer, or the fifth metal layer has a width of 1.7 μm; and two adjacent first connecting lines of the first connecting lines are located in two of the first metal layer, the second metal layer, the third metal layer, the fourth metal layer, or the fifth metal layer, and a distance between the two adjacent first connecting lines is 1.6 μm or 1.5 μm.

31. The display panel according to claim 22, wherein the first connecting lines comprise first-type connecting lines and second-type connecting lines, and the display panel further comprises pixel driving circuit groups arranged in the second direction; and wherein in the second direction, one of the first-type connecting lines that corresponds to the first scanning control signal line, one of the second-type connecting lines that corresponds to one of the second scanning control signal lines electrically connected to one pixel driving circuit group of the pixel driving circuit groups, one of the first-type connecting lines that corresponds to the third scanning control signal line, one of the first-type connecting lines that corresponds to the light-emitting control signal line, one of the first-type connecting lines that corresponds to the fourth scanning control signal line, one of the second-type connecting lines that corresponds to another second scanning control signal line of the second scanning control signal lines electrically connected to one pixel driving circuit group of the pixel driving circuit groups, one of the second-type connecting lines that corresponds to the second reset signal line, one of the second-type connecting lines that corresponds to the signal adjusting line, and one of the second-type connecting lines that corresponds to the first reset signal line are sequentially arranged.

32. The display panel according to claim 22, wherein the first connecting lines comprise first-type connecting lines and second-type connecting lines, and the display panel further comprises pixel driving circuit groups arranged in the second direction; and wherein in the second direction, one of the first-type connecting lines that corresponds to the first scanning control signal line, one of the second-type connecting line that corresponds to one of the second scanning control signal lines electrically connected to one pixel driving circuit group of the pixel driving circuit groups, one of the first-type connecting lines that corresponds to the third scanning control signal line, one of the first-type connecting lines that corresponds to the light-emitting control signal line, one of the first-type connecting lines that corresponds to the fourth scanning control signal line, one of the second-type connecting lines that corresponds to the signal adjusting line, one of the second-type connecting lines that corresponds to the first reset signal line, one of the second-type connecting lines that corresponds to another second scanning control signal line of the second scanning control signal lines electrically connected to one pixel driving circuit group of the pixel driving circuit groups, and one of the second-type connecting lines that corresponds to the second reset signal line are sequentially arranged.

33. The display panel according to claim 15, wherein the at least one first-type signal line comprises a plurality of first-type signal lines, and the first-type driving circuit comprises a first-side driving circuit and a second-side driving circuit, wherein the display region is located between the first-side driving circuit and the second-side driving circuit in the first direction, one of the plurality of first-type signal lines is electrically connected to the first-side driving circuit, and another one of the plurality of at least one first-type signal lines is electrically connected to the second-side driving circuit.

34. The display panel according to claim 33, wherein the first-side driving circuit comprises a first scanning control circuit and a light-emitting control circuit, wherein the first scanning control circuit is electrically connected to the first scanning control signal line, and the light-emitting control circuit is electrically connected to the light-emitting control signal line, and wherein the second-side driving circuit comprises a third scanning control circuit and a fourth scanning control circuit, wherein the third scanning control circuit is electrically connected to the third scanning control signal line, and the fourth scanning control circuit is electrically connected to the fourth scanning control signal line.

35. The display panel according to claim 1, further comprising second signal lines located in the display region, wherein one of the second signal lines has at least one part extending in the second direction, and the second signal lines are arranged in the first direction and at least partially surround one of the at least two functional component regions.

36. The display panel according to claim 35, wherein the second signal lines comprise a first power supply voltage line.

37. The display panel according to claim 35, wherein the second signal lines comprise second connecting lines, wherein each of the second connecting lines electrically connects parts of one of the second signal lines that are located at two sides of one of the at least two functional component regions.

38. The display panel according to claim 37, wherein one of the second connecting lines has at least one part located in the display region.

39. The display panel according to claim 37, wherein one of the second connecting lines has at least one part located between a second non-display region and one of the at least two functional component regions, wherein the second non-display region at least partially surrounds the display region;

or the second connecting line has at least one part located between two adjacent functional component regions of the at least two functional component regions.

40. The display panel according to claim 35, wherein the display panel further has a second non-display region that at least partially surrounds the display region, and the display panel further comprises a connecting bus located in the second non-display region, wherein the connecting bus is electrically connected to the second signal lines.

41. The display panel according to claim 35, wherein one of the at least two functional component regions comprises a first functional component sub-region and a second functional component sub-region that are arranged in the first direction.

42. The display panel according to claim 41, wherein at least one second signal line of the second signal lines is arranged between the first functional component sub-region and the second functional component sub-region.

43. A display apparatus, comprising a display panel, wherein the display panel has a display region and at least two functional component regions, wherein the display region at least partially surrounding the at least two functional component regions, and the at least two functional component regions are arranged along a first direction; and wherein the display panel comprises:

first signal lines located in the display region, wherein at least part of each first signal line of the first signal lines extends in the first direction, and the first signal lines are arranged in a second direction intersecting with the first direction, wherein the first signal lines comprise at least one first-type signal line and at least one second-type signal line, wherein one of the at least one first-type signal line at least partially surrounds the at least two functional component regions, and at least one of the at least one second-type signal line is broken at two sides of one functional component region of the at least two functional component regions in the first direction;

wherein the display panel has a dummy line extending in the second direction and comprises a first edge and a second edge that are opposite to each other in the first direction, wherein a distance d1 between the first edge and the dummy line and a distance d2 between the second edge and the dummy line satisfy 0.9≤d1/d2≤1.1, and wherein the at least two functional component regions comprise a first functional component region and a second functional component region, wherein the dummy line passes through the first functional component region, and one of the at least one second-type signal line is broken at two sides of the first functional component region in the first direction.

* * * * *